(12) United States Patent
Wihardja et al.

(10) Patent No.: US 8,682,002 B2
(45) Date of Patent: Mar. 25, 2014

(54) SYSTEMS AND METHODS FOR TRANSDUCER CALIBRATION AND TUNING

(75) Inventors: James Walter Wihardja, Fullerton, CA (US); Mouna Elkhatib, Tustin, CA (US)

(73) Assignee: Conexant Systems, Inc., Irvine, CA (US)

(*) Notice: Subject to any disclaimer, the term of this patent is extended or adjusted under 35 U.S.C. 154(b) by 652 days.

(21) Appl. No.: 12/828,565

(22) Filed: Jul. 1, 2010

(65) Prior Publication Data

US 2011/0002471 A1     Jan. 6, 2011

Related U.S. Application Data

(60) Provisional application No. 61/222,862, filed on Jul. 2, 2009.

(51) Int. Cl.
| | |
|---|---|
| *A61F 11/06* | (2006.01) |
| *H04R 29/00* | (2006.01) |
| *H03G 5/00* | (2006.01) |
| *G06F 7/00* | (2006.01) |

(52) U.S. Cl.
USPC ............... 381/72; 381/58; 381/59; 381/98; 707/705

(58) Field of Classification Search
USPC ............ 381/56, 58, 59, 104, 103, 98; 700/94; 707/705
See application file for complete search history.

(56) References Cited

U.S. PATENT DOCUMENTS

| | | | |
|---|---|---|---|
| 6,111,755 A | 8/2000 | Park | |
| 7,016,509 B1 * | 3/2006 | Bharitkar et al. | 381/98 |
| 8,391,503 B2 * | 3/2013 | Bayley et al. | 381/59 |
| 2004/0002781 A1 * | 1/2004 | Johnson | 700/94 |
| 2005/0123144 A1 * | 6/2005 | Wallace | 381/56 |
| 2008/0075306 A1 * | 3/2008 | Poulsen et al. | 381/111 |
| 2008/0130906 A1 * | 6/2008 | Goldstein et al. | 381/58 |
| 2009/0147134 A1 * | 6/2009 | Iwamatsu | 348/484 |

OTHER PUBLICATIONS

Mackie; "Will the real maximum SPL please stand up" Mar. 31, 2009.*
IDT, "IDT GS Mark Compliance of PC Headphones" Oct. 16, 2008.*
Dolby Virtual Speaker Technology: Fundamental Principles; 5 pages; Jan. 1, 2009.

* cited by examiner

*Primary Examiner* — Mohammad Islam
*Assistant Examiner* — David Ton
(74) *Attorney, Agent, or Firm* — Jackson Walker L.L.P.; Christopher J. Rourk

(57) ABSTRACT

Audio transducers (headphones, speakers, microphones) inherently do not accurately reproduce the signal presented to them at the input. This can be compensated for by taking into account the transducer characteristics and transforming the input signal using a digital signal processor (DSP) to counteract the inaccuracies. However, for the compensation to take place, the DSP needs to know the characteristics of the transducer. For systems with built-in transducers (like laptops with internal speakers) the characteristics of the internal speakers can be stored on the hard-drive of the laptop and the DSP can read this data and make the appropriate compensations. Because a transducer (headphone, speaker, microphone) has its own characteristics that need to be compensated for separately, a profile is supplied to the DSP either by a database lookup based on an identification made by the user or transducer itself or by profile information stored on the transducer. Once the characteristics of a transducer are known, many additional DSP algorithms can be applied in order to improve the audio performance and even safety of the system.

49 Claims, 19 Drawing Sheets

SYSTEMS AND METHODS FOR TRANSDUCER CALIBRATION AND TUNING

RELATED APPLICATIONS

This application claims priority under 35 U.S.C. §119 to U.S. Patent Application No. 61/222,862 filed Jul. 2, 2009, entitled "Systems and Methods for Transducer Calibration and Tuning," which is incorporated by reference herein.

BACKGROUND OF THE INVENTION

1. Field of the Invention

The present invention relates generally to audio transducers and specifically with the compensation of transducer characteristics.

2. Related Art

An audio transducer converts between electrical energy and sound energy. Well known for the conversion from electrical to sound are speakers and headphones and from sound to electrical are microphones. Unfortunately, audio transducers inherently do not accurately reproduce the signal presented to them at the input. For example, the frequency response across the entire audible spectrum is seldom flat. Meaning in the case of reproduced sound, the speakers or headphones would reproduce some frequencies more loudly than others.

Traditionally, equalizers have been used to compensate for the inaccuracies in reproduction and/or recording. Even in old stereo equipment, graphic equalizers were available to correct for spectral variations in the sound reproduction. The difficulty in this approach is that the user relies on hearing and personal preferences to manually manipulate a series of filters. The number of controls is small and the adjustment could only be made very coarsely.

FIG. 1 shows a sound recording and/or reproduction system typical of modern personal computers (PC) and personal electronic devices. In the reproduction path of host device 100, a digital electrical sound signal is received from source 102. Examples of source 102 can be storage 104 or alternate source 106 which can be a computer network As an example, storage 104 can contain a song which is stored on hard disk. An example of alternate source 106 is a streaming source, such as a live radio broadcast over the Internet. Often the alternate source 106 uses storage 104 to buffer the signal. The digital electrical sound signal is processed by digital stage 108 which often comprises digital signal processor (DSP) 110. DSP 110 may be coupled to memory 112 and/or central processing unit (CPU) 114. Often a single processor functions as both DSP 110 and CPU 114 especially for personal electronic devices. Memory 112 and/or CPU 114 can control the retrieval of the digital electrical sound signal as well as direct the DSP as to the type of processing to be performed. The processed digital electrical sound signal is converted to an analog electrical sound signal by digital to analog converter (DAC) 116. The analog electrical sound signal is then processed by analog stage 118 which often comprises amplifier 120. The analog electrical sound signal then drives a transducer such as headphone 122 or speaker 124 which produces an acoustical sound signal.

On the recording path, a transducer such as microphone 152 records an acoustical sound signal into an analog electrical sound signal, which is processed by analog stage 118 which often comprises amplifier 154. Analog stage 118 conditions the analog electrical sound signal so it can be converted to digital by analog to digital converter (ADC) 156. The digital electrical sound signal is then processed by digital stage 108 which often comprises DSP 110. Like in the reproduction path, DSP 110 can at the direction memory 112 and/or CPU 114 further process the digital electrical sound signal. The signal can then transmitted to receiving medium 158. For example, the signal can be stored as a sound file in 104 or transmitted over computer network 160.

DSP 110 is capable of compensating for the inaccuracies in the reproduction of sound due to the characteristics of the transducers. If the characteristics of the transducers are known, the electrical audio signal can be preconditioned to compensate for the inaccuracies of the audio transducers before reproducing the sound, and similarly the inaccuracies of an audio transducer can be corrected for recording a sound.

Once the characteristics of a transducer are known, many additional DSP algorithms can be applied in order to improve the audio performance and even safety of the system. As a simple example, the transfer function of a speaker can be measured. The speaker inaccuracies present in the transfer function can be compensated for by applying a filter with the inverse of the transfer function to the electrical audio signal prior to supplying the signal to the speaker. The net result is that the effect of the filter and the inaccuracies of the speaker cancel out.

In the past, even before the ubiquity of DSPs, some high end speaker manufacturers provided a specific equalizer to compensate for the known frequency response deficiencies of their speakers. In the PC or personal electronic devices, the characteristics of internal speakers as well as built-in microphones can be stored on a hard drive, read-only memory (ROM) or some other form of non-volatile memory. The onboard DSP can read this data and make appropriate compensation.

However for external speakers, headphones or microphones, the precise transducer characteristics are not known. Because the transducer characteristics can vary greatly, no universal compensation technique could be applied with much success.

At present, the best PC's and other personal electronics offer is to present a graphic equalizer that enable the user to adjust the frequency response by hand. FIG. 2 shows the same audio processing system as shown in FIG. 1. The diagram is expanded to show display 202 which for a computer can be a monitor and user input-output (I/O) device 204, shown here for a computer as keyboard and mouse, but for personal electronics devices could be a touchpad, wheel, or a variety of other interfaces. Shown on display 206 is a virtualization of a graphic equalizer, the user can use I/O device 204 to manipulate sliders within the graphic equalizer to adjust the gain or attenuation over a certain frequency band, emulating the graphic equalizer seen in many stereo systems. Alternatively a limited set of equalization presets are made available for the user to select from. Neither approach can offer the granularity needed for proper compensation.

Proper compensation generally needs parametric equalization where each filter's center frequency, amplitude and bandwidth can be adjusted. While parametric equalization could be made available to the end user. Short of being a sound engineer, a user would find these parameters too complicated to comprehend let alone adjust. Furthermore, the typical end user does not have the proper equipment to measure the frequency response. In an ideal setting, the right bandwidth, gain and center frequency of a parametric equalizer would require calibrated microphones. In the case of headphones, a "head and torso simulator" device is required to mimic the response of a headphone when sealing to an actual human head.

In addition to accurate reproduction, speakers and headphones may be further constrained. For safety, the headphone output should be limited to a certain sound pressure level (SPL). Many safety mechanisms require the user to "guess" how loud his music is playing at as a result, the user can not really be assured that he is not damaging his hearing. To this end, the European union issues a Geprüfte Sicherheit (Tested Safety) Mark or GS Mark for portable media devices that limits output a certain number of millivolts. However, different transducers can be louder or quieter even at the same voltage output based on sensitivity and impedance. Therefore headphones with the GS-Mark standard can over-protect or under-protect based on its transducer.

SUMMARY OF INVENTION

A system and method for providing profile information of a transducer to a host device is described. In one embodiment, the end user supplies information identifying the transducer that was attached. The profile of the attached transducer is retrieved from a database either locally stored, accessed over a computer network or both, based on the supplied identification. The profile is supplied to a DSP where appropriate signal compensation and enhancement can take place.

In another embodiment, the transducer is identified through an RFID tag. The profile is retrieved from a database and supplied to the DSP. In yet another variant, the profile is stored on the RFID tag where the host device can retrieve it.

In yet another embodiment, the transducer comprises circuitry to deliver either identification information, part of the transducer profile, or all of the transducer profile over a connection to the host device. This connection could be a computer connection, such as a USB, Firewire or other connection or an audio connection such as through either a tip-ring-sleeve (TRS) or tip-ring-ring-sleeve (TRRS) connector.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

As mentioned above, the DSPs included in most modern computer systems and many personal electronic devices can be used to compensate for transducer inaccuracies. In addition, they can be used to enhance the quality and safety of the listening experience. In the case of built-in devices, the characteristics of a transducer are known, so compensation and enhancements can be made.

However, even when transducers are built-in devices, manufacturers often substitute different speakers for the intended speaker. This substitution often takes place without consideration of the operating system which may already contain a profile for the intended speaker. In a different scenario, an end user could take a notebook computer for repair where the repair shop could substitute a different set of speakers for the original speakers, again without consideration of the operating system. With the wrong profile any pre-programmed compensation or enhancements would be misplaced on the wrong model of transducer.

Figure 3A:
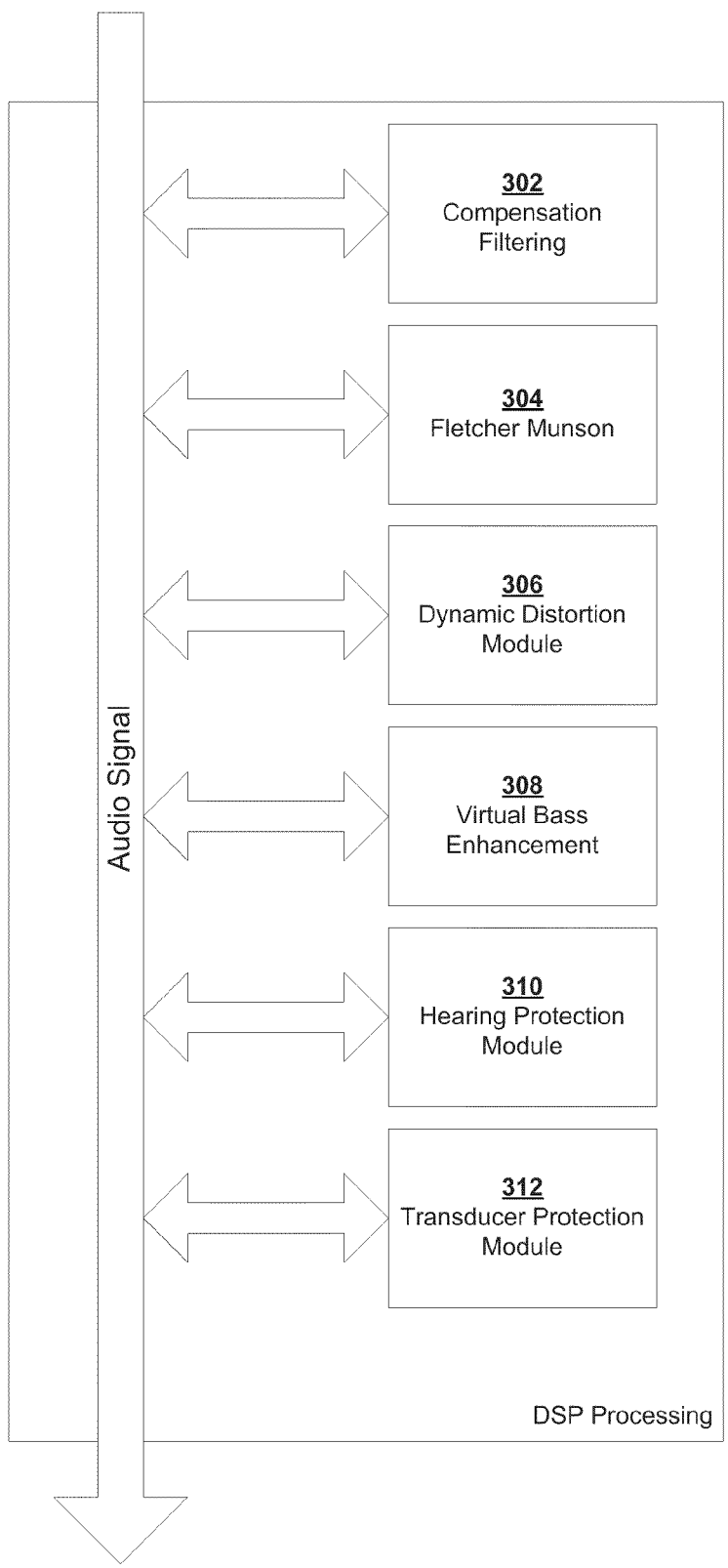
FIG. 3A illustrates a functional diagram illustrating the algorithms that can be applied by a DSP to a reproduction.

FIG. 3A illustrates a functional diagram illustrating the algorithms that can be applied by a DSP to a reproduction. Module 302 is a compensation filtering module. Given a transducer's response curve, the compensation filtering module can be used to compensate for the transducer's inability to generate flat frequency response over the audio range. This can be accomplished by custom designing finite impulse response (FIR) or infinite impulse response (IIR) filter or by selecting an arbitrary number of band pass filters where the bandwidth, center frequency and amplitude can be specified by a parametric equalization algorithm.

Figure 4A:
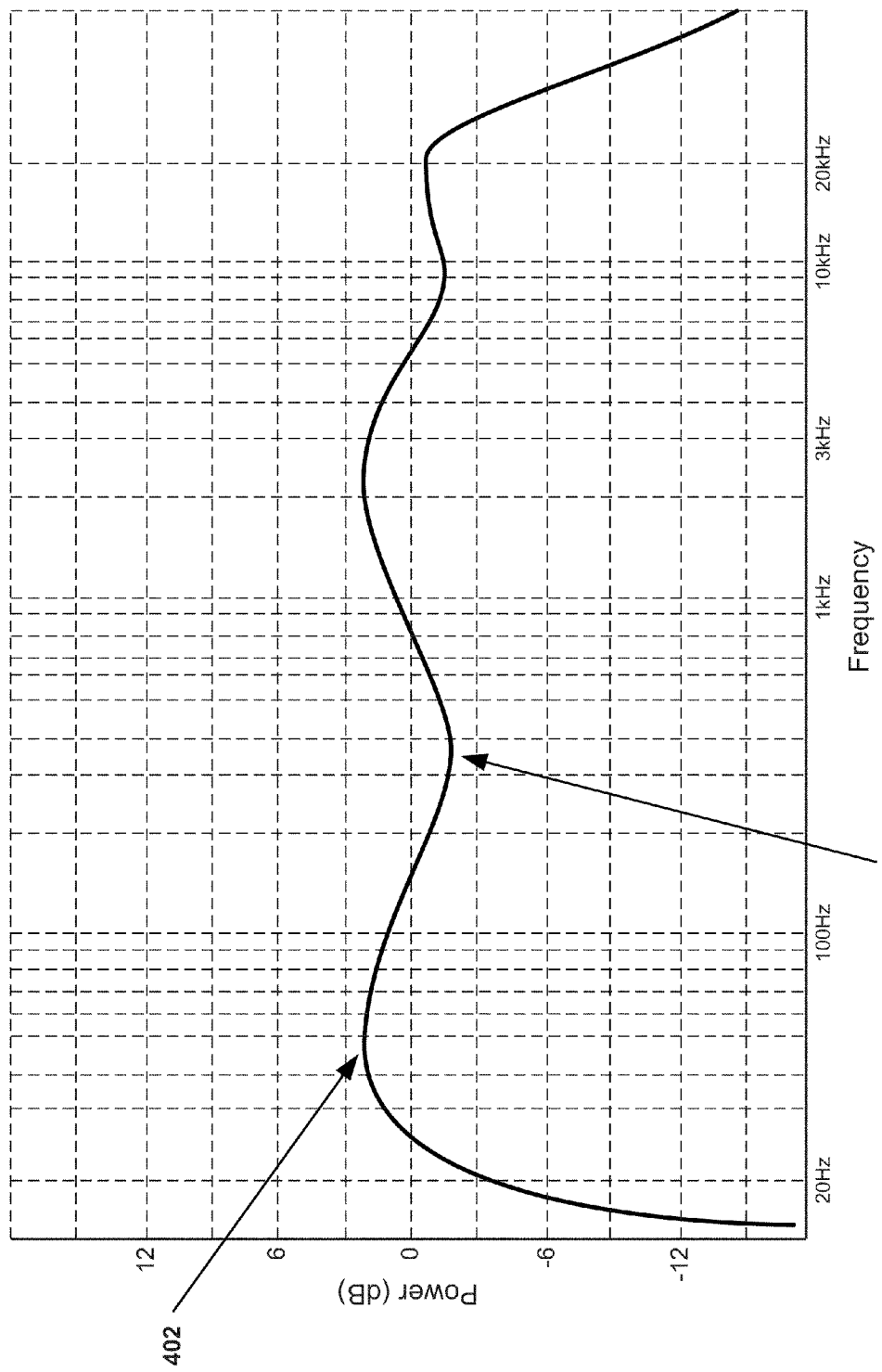
FIG. 4A illustrates a hypothetical frequency response of a speaker.
Figure 4B:
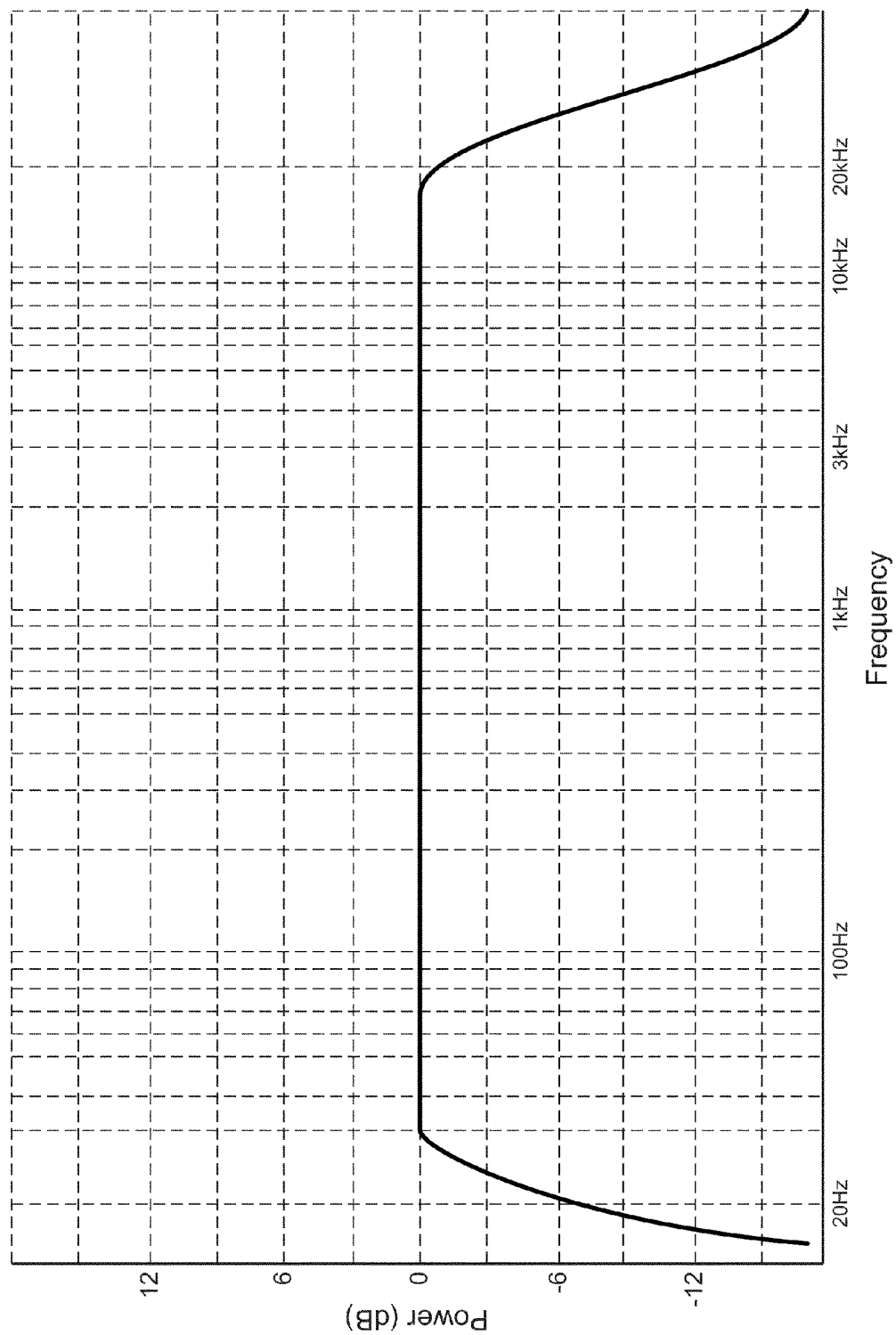
FIG. 4B illustrates an ideal flat response.

For example, FIG. 4A illustrates a hypothetical frequency response of a speaker. Point 402 at approximately 50 Hz is above 0 dB and point 404 at approximately 300 Hz is below 0 db. The compensation filtering module would attenuate the signal at around 50 Hz and boost the signal around 300 Hz to yield a flatter response curve. FIG. 4B illustrates an "ideal" flat response. The transducer frequency response remains flat over the entire audio range.

Figure 5:
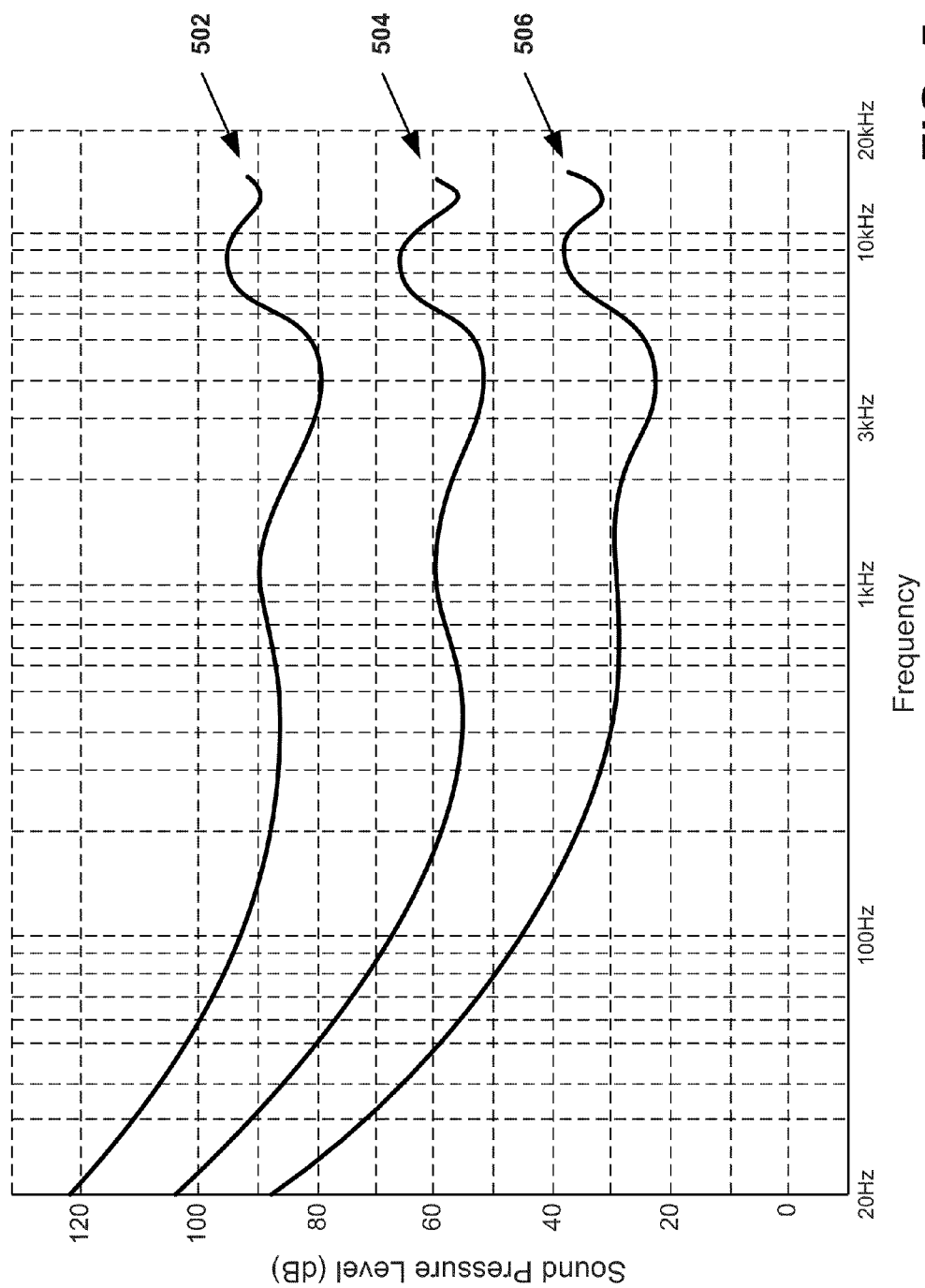
FIG. 5 shows some exemplary Fletcher-Munson curves.

Module 304 is a Fletcher-Munson matching algorithm. For over half a century it has been known that sound at different frequencies at the same SPL are perceived at different "loudness," measure in units called phon. Curves of constant loudness are known as Fletcher-Munson curves. FIG. 5 shows some exemplary Fletcher-Munson curves. Curve 502 represents a 90 phon level. Curve 504 represents a 60 phon level. Curve 506 represents a 30 phon level. In this example, it can be seen that an SPL of about 30 dB produces a 30 phon output level at about 500 Hz. However, at 100 Hz an SPL of about 45 dB is required to produce the same perceived loudness. It should be noted that the curves shapes vary for a given number of phon. For example, the curves tend to flatten out for a large number of phon. Module 304 using the transducer response, the transducer sensitivity and the transducer impedance can determine the amplitude needed to produce a given SPL. Knowing the number of phon that should be produced for a given input signal, module 304 can compensate for it so that the sounds are perceived to be uniform across the audio frequency range.

Module 306 is a dynamic distortion module. Often with speakers particularly small inexpensive speakers, there are certain vulnerable frequencies that cause the sound to be distorted or the speakers to rattle. These frequencies can vary from speaker to speaker and certainly from speaker models to speaker models. If these frequencies are known, there are methods that can be used to avoid the distortion while having minimal impact on the overall frequency response. One method is given in U.S. patent application Ser. No. 12/712,108, entitled "Speaker Distortion Reduction System and Method," filed on Feb. 25, 2009, which is hereby incorporated by reference.

Module 308 is a virtual bass enhancement module. Many speakers have limitations as to their ability to reproduce low frequencies (or bass frequencies). In fact, excessive bass frequencies can even damage some small speakers. In order to avoid losing the bass experience in a reproduction, there are psychoacoustic methods that can simulate low frequencies. However, to most effectively apply these techniques the low frequency cut off needs to be known. This too can vary from speaker to speaker and certainly from speaker models to speaker models.

Module 310 is a hearing protection module. By using known transducer sensitivity, the hearing protection module can accurately predict the SPL produced by the transducer. If the SPL exceeds safe listening levels, it can either attenuate the output either digitally or by adjusting the gain on the analog amplifier, or through a display warn the user that his hearing may potentially be damaged. Without the knowledge of transducer sensitivity the precise electrical signal level cannot be accurately related to the SPL.

Module 312 is a transducer protection module. By using known transducer power ratings, transducers that are not externally powered such as built-in speakers and headphones can be protected. If a sustained power output exceeds the transducer's power rating, the transducer can be damaged. By measuring or estimating the output power, the transducer protection module can compare the output power with the transducer's power rating. If the power rating is exceeded, the signal can be attenuated digitally or the gain on the analog amplifier can be reduced to prevent damage to the transducer.

Clearly, if relevant transducer information were obtained, the user listening experience can be corrected for transducer inaccuracies and enhanced. However, unlike with built-in speakers, with third party transducers, the reproduction device does not know the transducer characteristics.

Figure 3B:
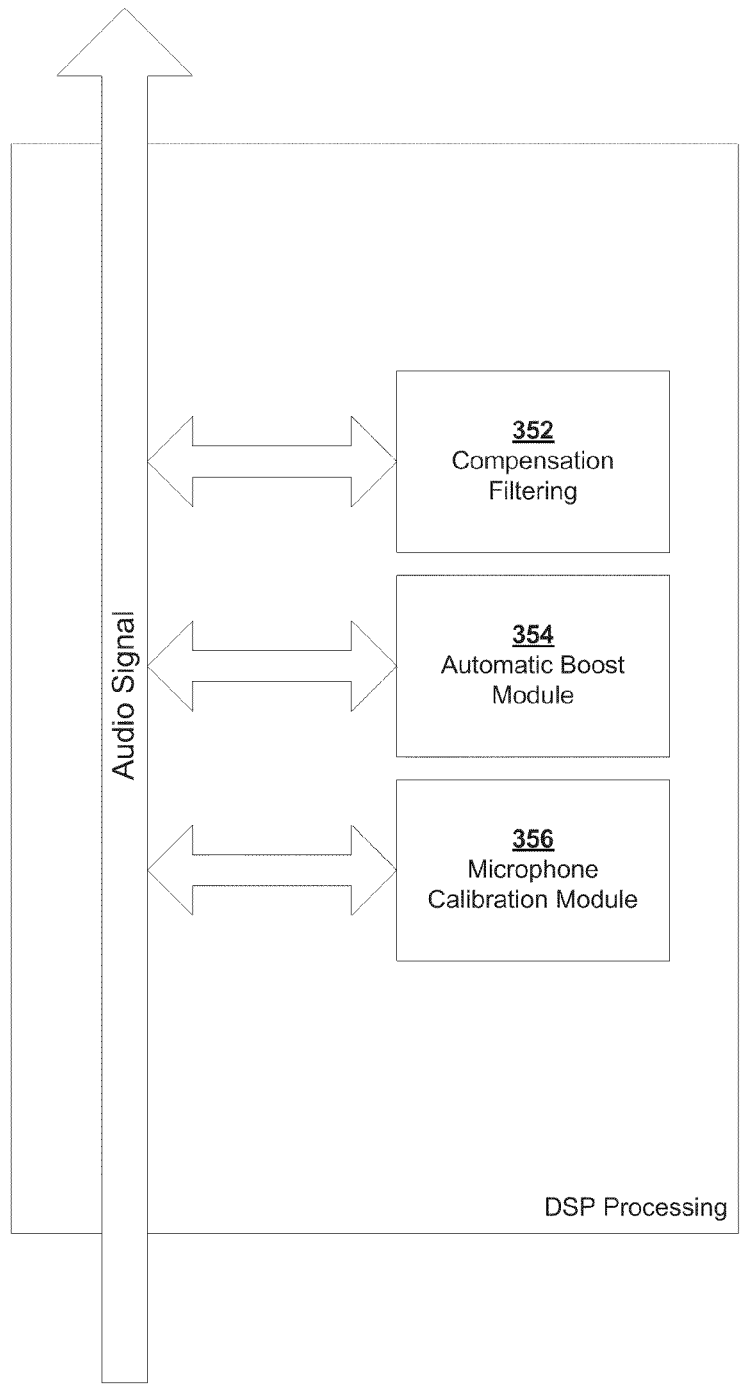
FIG. 3B illustrates a functional diagram illustrating the algorithms that can be applied by a DSP to a recording.

FIG. 3B illustrates a functional diagram illustrating the algorithms that can be applied by a DSP to a recording. Module 352 is a compensation filtering module. Module 352 uses a microphone's response curve; the compensation filtering module can be used to compensate for the microphone's varying sensitivity over the audio range to produce a flat frequency response. This can be accomplished by custom designing FIR or IIR filter or by selecting an arbitrary number of band pass filters where the bandwidth, center frequency and amplitude can be specified by a parametric equalization algorithm. Alternatively, the compensation filtering module can be used to give the microphone a desired frequency response rather than a flat frequency response.

Module 354 is an automatic boost module. Typically, input from a microphone has gain or boost applied. The user is often asked to calibrate the ideal recording level through the operating system or an application. By using known microphone sensitivity, the analog boost that a signal received from a microphone can be set without the need for user calibration. Alternatively, the default analog boost level can be set by the automatic boost module as a starting point for user calibration therefore making the calibration process faster and simpler.

Module 356 is a microphone calibration module. Module 356 uses the microphone sensitivity and frequency response curve from the transducer profile to generate calibration data which represents the relationship between the SPL and the voltage of the microphone signal received. The calibration level can be supplied to the operating system or an application. With an appropriate calibration level, an application can measure accurately the ambient SPL in the environment and can adjust playback accordingly. For example, if a room is very noisy, a playback application using the microphone signal as well as the calibration data would be aware of the noise level in the room and could automatically increase the volume of the playback to overcome the noise.

Like in the reproduction path, if relevant transducer information were obtained, the user recording experience can be corrected for transducer inaccuracies and enhanced. However, unlike with built-in microphones, with third party transducers, the recording device does not know the transducer characteristics.

Figure 1:
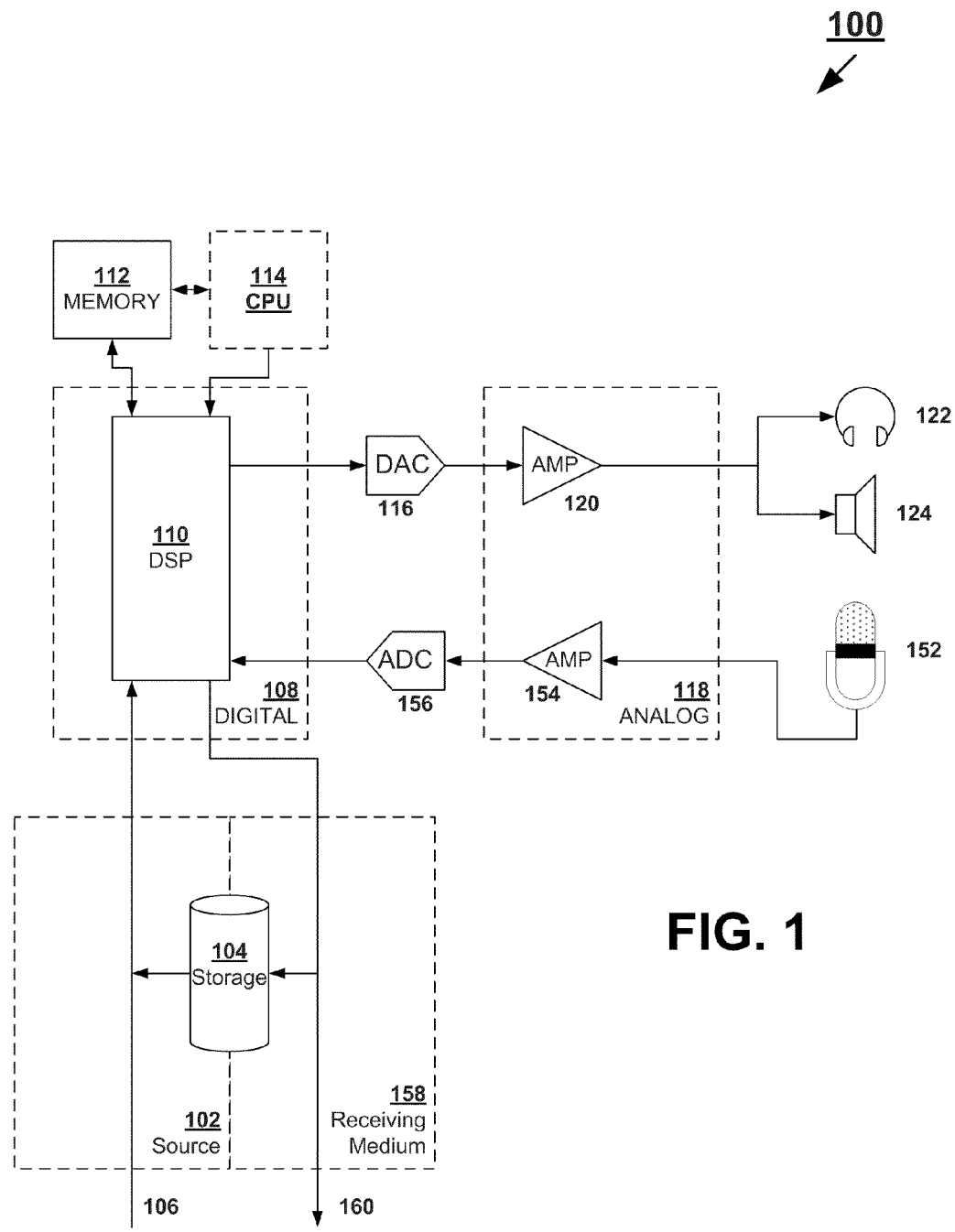
FIG. 1 shows a sound recording and/or reproduction system typical of modern personal computers (PC) and personal electronic devices.
Figure 2:
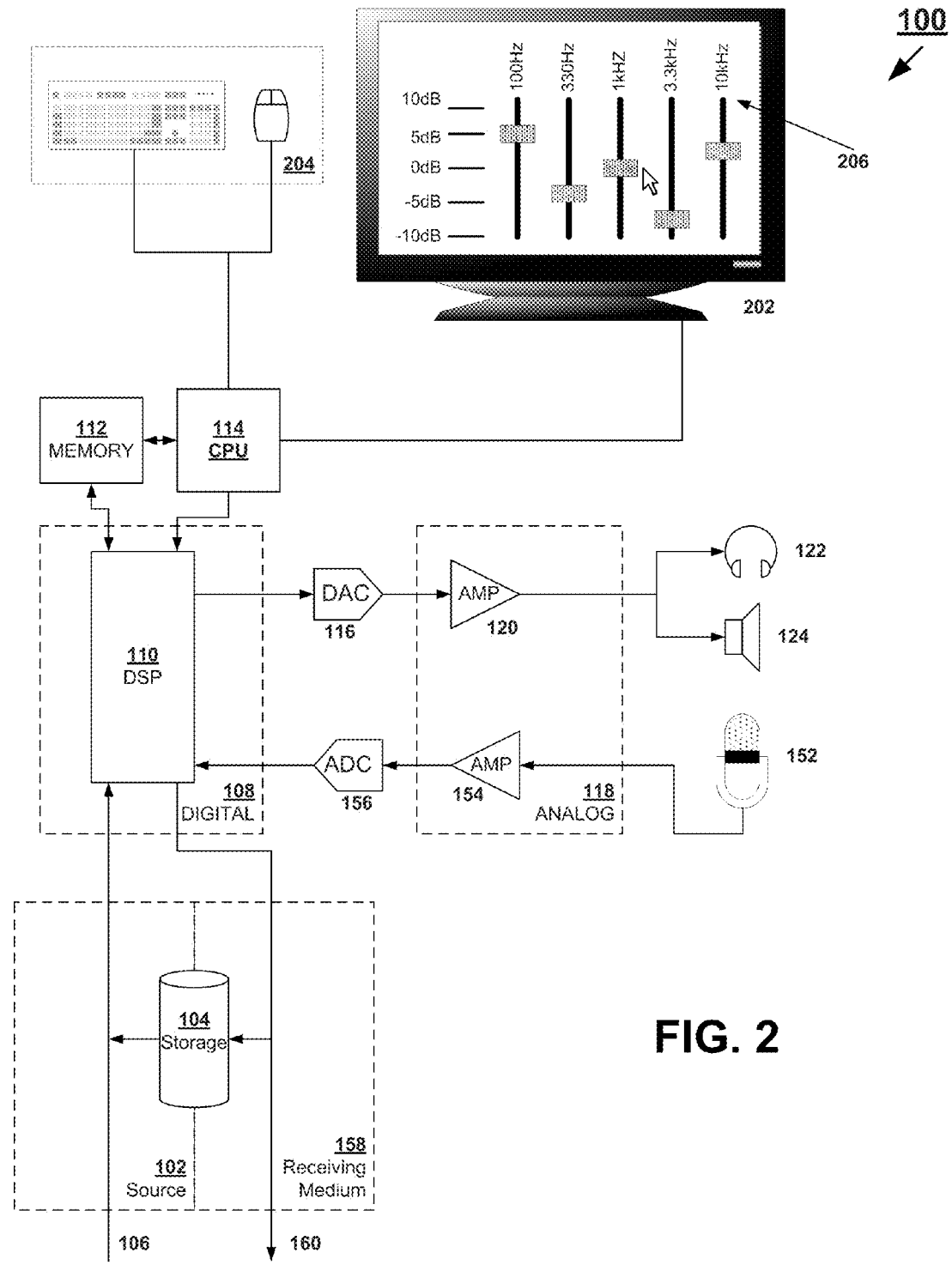
FIG. 2 shows the same audio processing system as shown in FIG. 1 with a user adjustable graphic equalizer.
Figure 6:
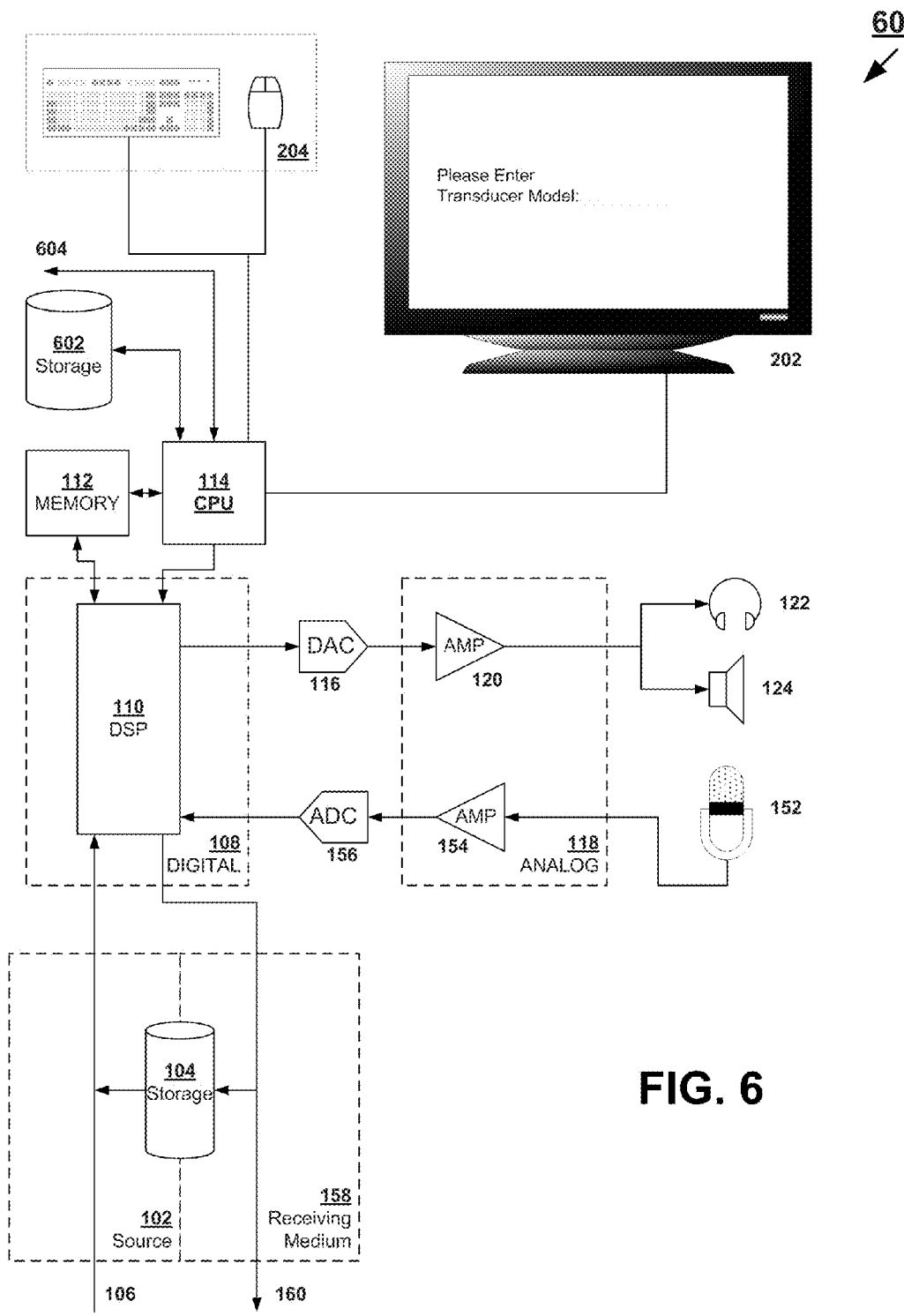
FIG. 6 illustrates host device with sound reproduction and/or recording capabilities, similar to that shown in FIG. 2.

FIG. 6 illustrates host device 600 with sound reproduction and/or recording capabilities, similar to that shown in FIG. 2. CPU 114 possibly with software contained in memory 112 provides a user interface to be displayed on display 202. Using I/O device 204, the user can select the transducer module he has just attached to the host device. Any number of approaches can be used to present the choices to the user such as providing a list of transducers for him to select, providing a list of manufacturer's first and narrowing the selection from there or even providing a general search mechanism.

When the user selects the appropriate transducer, the transducer profiles can be retrieved from database 602 and provided to DSP 110 which can run the various algorithms for compensation and enhancement. The transducer profiles can comprise the transducer type (e.g., microphone, built-in speaker, external speaker, headphones) the transducer manufacturer, model number and universal product code (UPC) for identification of the transducer. The profile can also comprise the transducer's frequency response curve over the audio range (for example from 20 Hz to 24 kHz), the transducer impedance, the transducer's sensitivity, manufacturer suggested enhanced response curve, critical distortion points, and limits based on frequency. To provide additional assistance to the DSP the transducer profile can provide flags for enabling or disabling individual DSP features.

It should be noted that database 602 in practice is likely to be contained in storage 102, but is shown separately for simplicity. Similarly, the algorithms shown in FIG. 3 are most commonly stored in memory 112 for use by DSP 110. In another variation, the profiles may be supplied over network connection 604. A combination of both can be provided. For example, common transducers can be stored locally, but more exotic transducers would be retrieved from a central server somewhere on the Internet.

One drawback of this approach is that it requires the user to be able to identify the transducer and select the correct transducer based on this information. As anyone who has ever tried to program a programmable remote control, the selection of an appropriate device is fraught with challenges for an end user. It is possible to tag participating transducers with a bar code or other electronically identifiable methods. However, this would require specialize hardware to be attached the host device.

Figure 7:
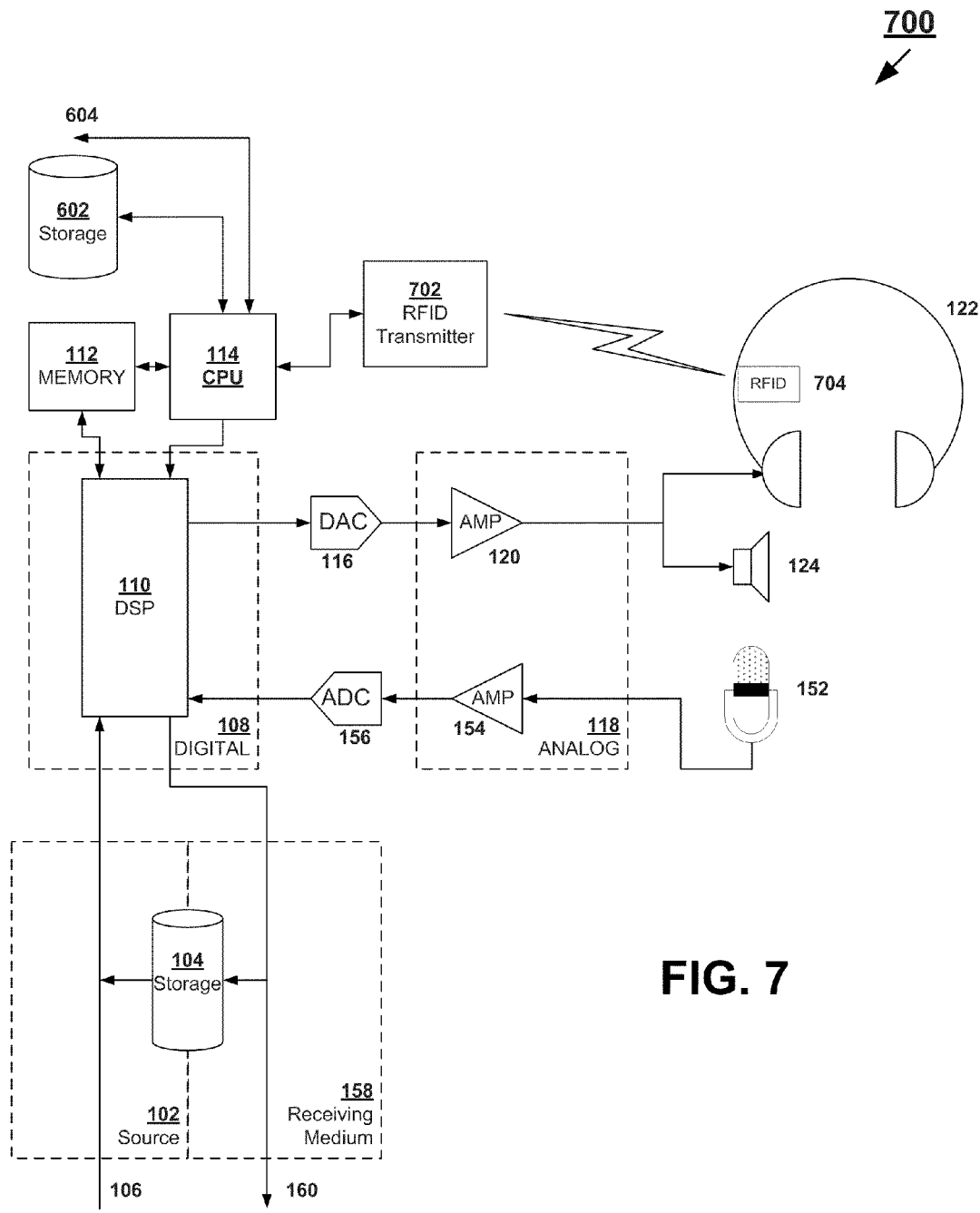
FIG. 7 shows a host device equipped with a radio frequency identification (RFID) transmitter.

FIG. 7 shows host device 700 equipped with a radio frequency identification (RFID) transmitter. RFID transmitter 702 communicates with RFID tag 704 on a transducer. The RFID tag could supply the transducer identification information to CPU 114 which can then retrieve the transducer profile from database 602 or alternatively over computer network 604. Of course, it could attempt first to retrieve the transducer profile from database 602 and then attempt to search a computer network for the transducer profile if it was not found in database 602. Due to the growing popularity of RFID, the inclusion of an RFID transmitter in a host device may become common.

Figure 8:
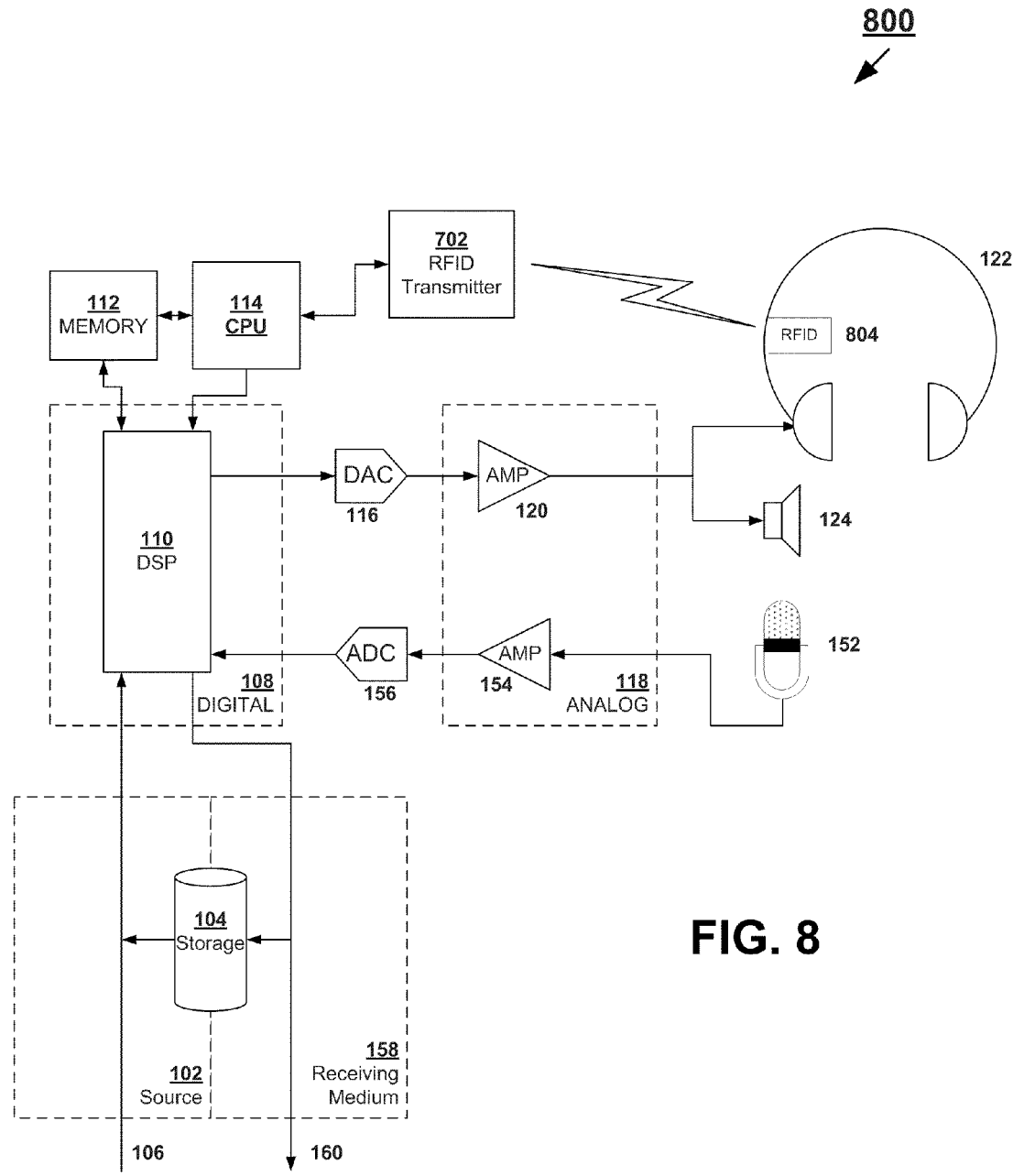
FIG. 8 shows another host device equipped with an RFID transmitter.

FIG. 8 shows another host device equipped with an RFID transmitter. Unlike host device 700, host device 800 does not retrieve the profile from a database or a computer network. Rather RFID tag 804 contains the transducer's profile. This profile is then transmitted back to RFID transmitter 702 where the profile could be supplied to DSP 110.

An additional advantage of having all the information located with the transducer is that the transducer profile could further be refined for the specific transducer. For example, during the quality assurance (QA) process, the transducer profile for the specific transducer can be measured and included in the RFID tag. Because of the additional accuracy, compensation and enhancement can be further improved. This also has the advantage that the transducer itself is not altered and the RFID tag can be added on rather than altering the manufacturing process. In either case, the RFID tag can store transducer information in some form of non-volatile memory.

One drawback of the RFID tag is that it may be difficult to distinguish between the transducer that is plugged into the host device and a transducer that is simply in the vicinity of the host device. One solution it to put the RFID transmitter close to the transducer jack and place the RFID tag on the jack, so that only the transducer close to the jack is read.

Another possibility is to use an active RFID tag rather than a passive one. An active RFID tag requires some additional power in order to operate. It can draw power from the electrical sound signal received by the transceiver. Very little power is needed, just enough so that the RFID tag knows it has been activated. The RFID tag can still obtain the remainder of its power from the RF signal transmitted by the RFID transmitter. Because of the low power draw, the RFID chip would not affect the audio signal reproduced by the transducer. When the transducer is plugged in the RFID tag detects power flowing to the transducer and activates. At the same time, the host device detects the insertion of the plug and causes RFID transmitter 702 to poll for nearby tags. Since the active RFID tag activates only around the time of plug in, it should be the only RFID tag responding to RFID transmitter 702.

Yet another possibility is to use a passive RFID tag to measure the transmitter strength. When the host device detects the plug in of a transducer, RFID transmitter 702 activates. Each RFID tag within range not only transmits identification information and optionally profile information, but also transmits the signal strength detected by the RFID tag. When the host device receives the information, it accepts the transducer information from the RFID tag which experienced the greatest transmitter power as that tag is likely to be the closest. While it is possible to us the return transmission power of the RFID tag itself to gauge distance, gauging distance in this matter is more complicated because due to potential variations in the manufacture of an RFID tag and the receive signal strength, the return transmission power may not be simply a function of distance.

The built-in transducer situation poses different challenges. An active RFID tag can be used as described above, which activates around the time power is first received by the transducer. However, at the time of initial transducer power up during the boot up process, the operating system may not be ready to activate the RFID transmitter. One solution is to equip RFID transmitter 702 with some memory to record state, so that RFID transmitter 702 can be powered up and activated around the same time as the transducers. When the operating system is ready, the host device can read the information from the RFID transmitter. Another possibility is to simply allow a long window after power up for the RFID tag to respond. For example, the RFID tag may be active for several minutes after power up. Another possibility is to transmit a special "wakeup" signal to the transducer so when the RFID tag detects the signal, it remains active for a short period after detection. This wakeup signal should be low energy and inaudible if possible, so it will not cause an audible artifact during power up.

Another solution is to use a passive RFID tag. Initially when in the factory, the host device could be powered up for normal QA. If the power up occurs sufficiently far away from any other built-in transducers then only the built-in transducer within the host device is the only one identified. Then every time the host device is booted up, it searches for RFID tags. If more than one RFID tag responds from a built-in transducer, the transducer information previously stored from the last time the host device was active is retained. Because the transducer information identifies the transducer, built-in transducers can be distinguished from plug-in transducers such as headphones, external microphones or external speakers; as a result, the presence of headphones, external microphones or external speakers nearby would not inhibit the ability of the host device to determine which built-in transducer is present.

In addition to built-in transducers, headphones, external speakers and/or external microphones should be scanned for during power up. There is a possibility that the user may switch external speakers and/or headphones during power up. If an RFID tag is able to identify itself by distance, then the nearest transducer is used. Alternatively, an active RFID tag should be the only transducer to respond during power up as described above. However, if multiple external speaker or headphones are detected during startup without any criterion for selection, the operating system can simply display a prompt indicating new hardware has been detected and the user is present with a choice to select the correct transducer.

While the transducer information or profile is described as being communicated wirelessly using RFID technology. Other wireless technologies could be used including Bluetooth or infrared data association (irDA), to transmit transducer information from a transducer to a host device.

Figure 9:
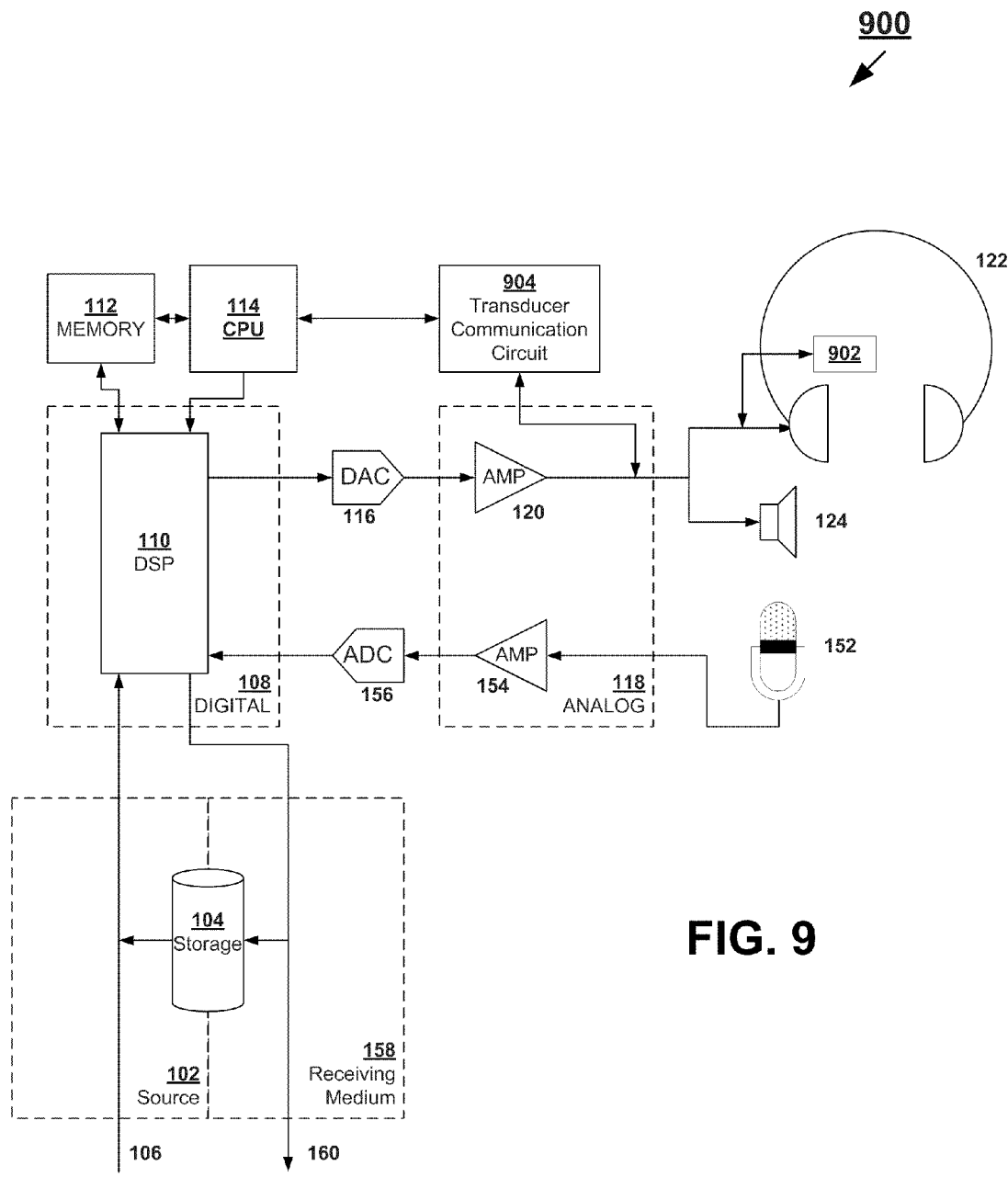
FIG. 9 illustrates a host device and transducer which is equipped with an identification circuit.

Another approach is to incorporate an identification circuit inside the transducer. FIG. 9 illustrates host device 900 and transducer 122 which is equipped with an identification circuit. Transducer identification circuit 902 is connected to the transducer and transducer communications circuit 904 is contained inside the host device. Transducer identification circuit 902 can transmit either transducer identification information which can be used like in host device 700 or transmit the entire transducer profile which can be used like in host device 800. The information is received by transducer communications circuit 904 which communicates the transducer identification information or transducer profile to CPU 114 which can then use it to direct the processing of DSP 110. The communications could be initiated by transducer communications circuit 904 or by transducer identification circuit 902 when first plugged in. Transducer identification circuit 902 can comprise a read-only memory (ROM) which contains either the transducer identification information or the transducer profile.

The challenge to this approach is the manner of communicating between transducer identification circuit 902 and transducer communications circuit 904. If the transducer is powered by a universal serial bus (USB) connection, serial communications between transducer identification circuit 902 and transducer communications circuit 904 can take place using the USB connection.

While USB connections are the most common "computer" connection types, other types of connections could be used including Firewire and external Serial Advanced Technology Attachment (SATA). Traditional "audio" connection types can also be used to convey either transducer identification information or the transducer profile.

Figure 10:
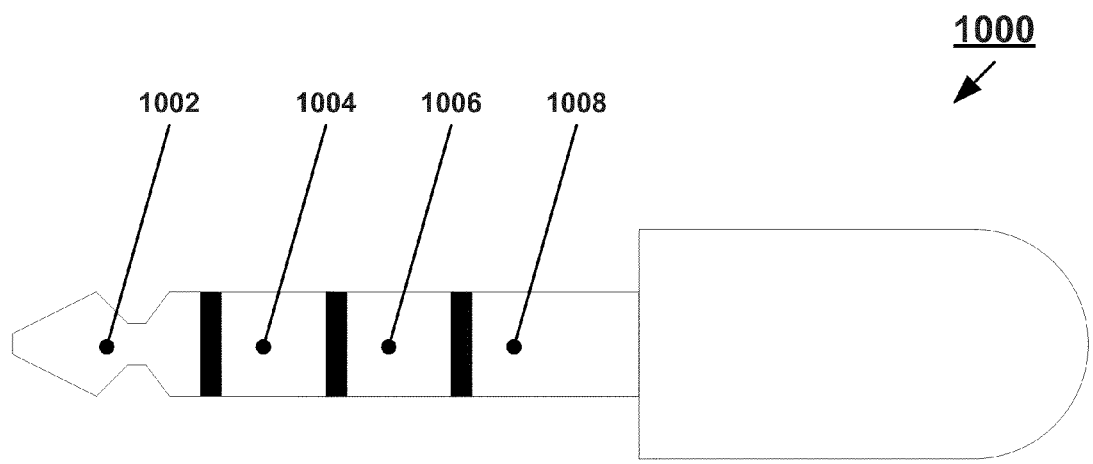
FIG. 10 shows a typical TRRS connector.

Increasingly, modern electronics have used a ⅛ inch "miniature" four-conductor TRRS connector. FIG. 10 shows a typical TRRS connector. Connector 1000 comprises tip 1002, rings 1004 and 1006 and sleeve 1008. Tip 1002 is usually used to carry the left channel signal in a stereo application. Ring 1004 is usually used to carry the right channel signal in a stereo application. Sleeve 1008 usually supplies a common ground. In modern uses, ring 1006 is sometimes used to convey digital information such as in the use of iPods and iPhones to enable the iPod or iPhone to control the headphones. In head set applications, ring 1006 is sometimes used to carry a signal from a microphone. For transmitting transducer information, ring 1006 can be used. However, if ring 1006 is used to carry a signal from a microphone, the ring 1006 along with the coupled conductors can be shared with the transducer information. However, care should be taken not to degrade the signal from the microphone. Methods to address this challenge are given below for the TRS connector. One should recognize that the ¼ inch standard TRRS connector or 3/32 in sub-miniature TRRS connector could be used instead.

Figure 11:
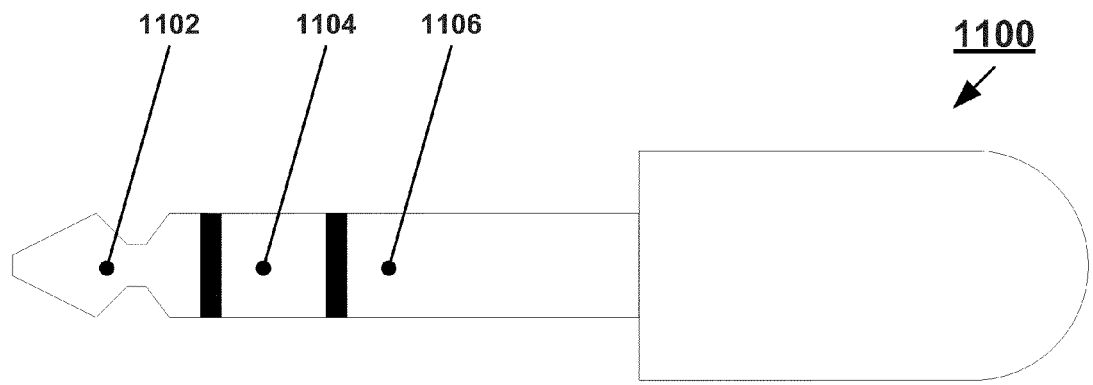
FIG. 11 shows a typical TRS connector.

FIG. 11 shows a typical TRS connector. Connector 1100 comprises tip 1102, ring 1104 and sleeve 1106. Like in connector 1000, tip 1102 typically carries the left channel of a stereo signal, ring 1104 carries the right channel of a stereo signal and sleeve 1106 provides a common ground. In this case the transducer information (identification or profile) is transmitted by sharing either the left channel, the right channel or both with the audio signal. Like the use of ring 1006 in connector 1000 with a microphone present, the sharing of conductors between the transducer information and the electrical audio signal should not cause degradation to the electrical audio signal.

One method of avoiding degradation is by transmitting the transducer information at a frequency outside the audio range; in fact, the communications can happen at a frequency many times the maximum audible frequency. For practical purposes, the frequency should not be selected so high as to run into communications issues. For example, very high speed communications typically require special certified cabling. Frequencies around 100 kHz-500 kHz could be used without necessitating high performance wires or circuitry. The transducer information signal could be added by mixing a high frequency digital signal onto either a left channel, right channel or both. Even in the case of a speaker or headphone where signals are viewed as flowing from the host device to the transducer, there is an ability to carry a signal back to the host device through the use of the left channel conductor, right channel conductor, or both.

Figure 12:
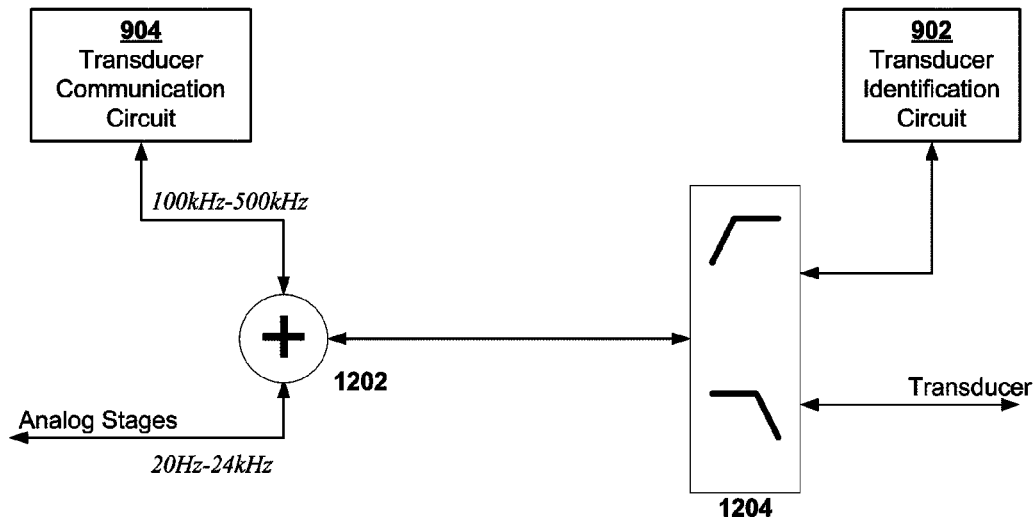
FIG. 12 illustrates a block diagram of communications between a transducer communications circuit and a transducer information circuit over the same conductor as the audio signal.

FIG. 12 illustrates a block diagram of communications between transducer communications circuit 904 and transducer information circuit 902 over the same conductor as the audio signal. The remainder of the host device is not shown for clarity. Transducer communications circuit 904 transmits power and/or command information which is mixed with the audio signal by mixer 1202. High-pass/low-pass crossover pair 1204 separates the high frequency information and transmits the information to transducer information circuit 1202 which can return information in the same fashion over the same conductor. Meanwhile the low frequency electrical audio signal is sent to the transducer.

One challenge is to provide power to the transducer information circuit. Typically, for external speakers an external power supply is used to power the speakers. This supply can easily be used to power the transducer information circuit. Microphones are normally biased, so they draw power from the host device either through a separate port or as a direct current (DC) voltage supplied to the microphone. The transducer information circuit can tap into the same power as the microphone. Headphones are generally totally driven by the electrical audio signal driven by the host device. With the exception of high end headphones which take batteries to power high end onboard signal processing, most headphones do not have an external source of power.

In the system of FIG. 12, high frequency power can be mixed in by mixer 1202 and extracted. By doing this, the power transmission from the transducer communication circuit to the transducer information circuit will not be audible. Separating the electrical audio signal from the power transmission and the data transmissions without degrading the audio signal can be tricky.

One solution is simply to suppress the transmission of electrical audio signal during a transducer identification phase. During this identification phase, there is no electrical audio signal and all other activity is performed at frequencies above the audible range. Because the transaction takes place above the audible range, if a legacy headphone were plugged in. The user would still experience no sound because the communications attempt would be beyond the hearing range.

Figure 13:
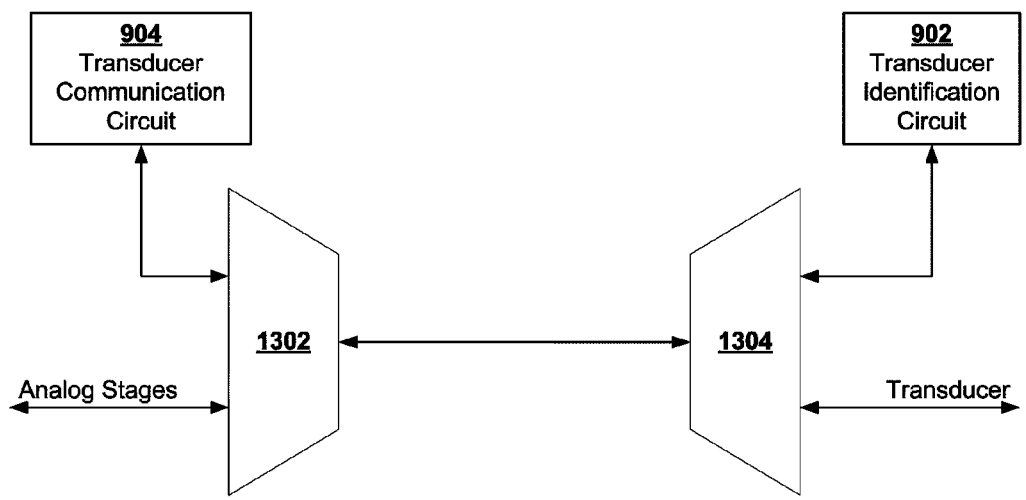
FIG. 13 illustrates another block diagram of communications between a transducer communications circuit and a transducer information circuit over the same conductor as the audio signal.

FIG. 13 illustrates another block diagram of communications between transducer communications circuit 904 and transducer information circuit 902 over the same conductor as the audio signal. During the initialization phase when a transducer is first plugged in. Switch 1302 connects transducer communications circuit 904 to the conductor at the same time switch 1304 connects transducer information circuit 902 to the conductor. During this period the analog sound signal is not connected to the conductor and neither is the transducer. When the initialization phase is over, the analog stages of the host device are once again connected to the transducer and the transducer communications circuit 904 and transducer information circuit 902 are disconnected from each other. Switches 1302 and 1304 can be implemented as simple switches or as a multiplexer/demultiplexer pair.

Because the duration of initial silence should be short, the amount of information transmitted should be minimized. Of course, the higher the carrier frequency the more information could be transmitted during this period. Therefore a tradeoff between the amount of information transmitted, the frequency used and the initial silence period would have to be weighed. Furthermore, it may be desirable to use both the left and right sound channels to double the amount of information that can be conveyed.

Compression of the transducer profile data can minimize the amount of data to be transmitted. Application specific compression can be used. For example, frequency response curves of a transducer is essentially smooth, so rather than sending a large number of samples. Key sample points of the frequency response curves can be transmitted along with the error associated with an interpolation, that is if 50 Hz sample and 120 Hz sample are included in the profile, rather than include the sample at 75 Hz, the value at 75 Hz is interpolated and only the error is transmitted. Transmitting only the error requires less resolution.

Figure 14:
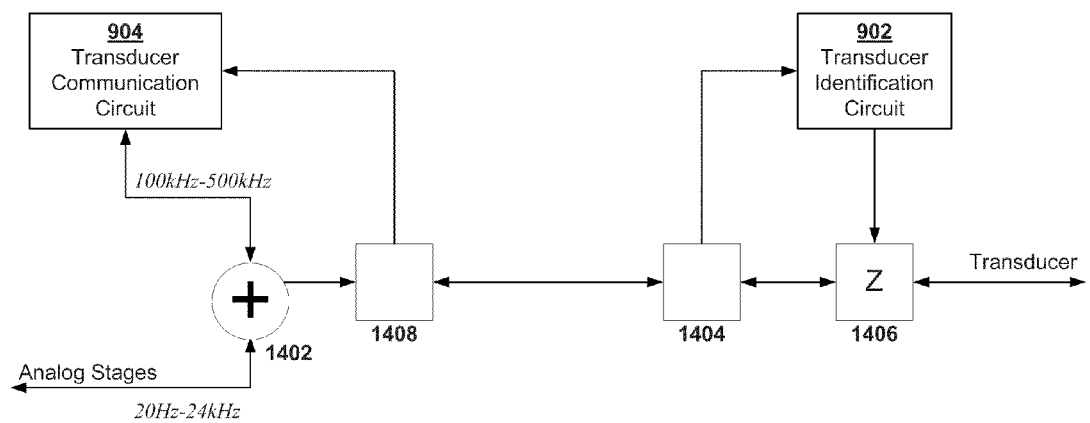
FIG. 14 illustrates an alternative communication system between a transducer information circuit and a transducer communications circuit.

However, if transducer information circuit 902 and the transducer communications circuit 904 are in communications when electrical audio signals are being transmitted, then there need for information compression is reduced. FIG. 14 illustrates an alternative communication system between transducer information circuit 902 and transducer communications circuit 904. Transducer communications circuit 904 transmits power at a high frequency over the conductor which can be performed by mixer 1402. Power extractor circuit 1404 extracts the high frequency signal to supply power to transducer information circuit 902. Transducer information circuit 902 alters the impedance of variable impedance unit 1406 at a high frequency so the modulation in impedance will not affect the audio signal received (or transmitted). The change in impedance is seen at the host device as a change in current being drawing. If impedance alteration is used as modulation, the modulation frequencies should still lie above the audio range for easier separation. Circuit 1408 detects high frequency changes in the current drawn and transducer communications circuit 904 can then decode the transducer profile information.

Figure 15A:
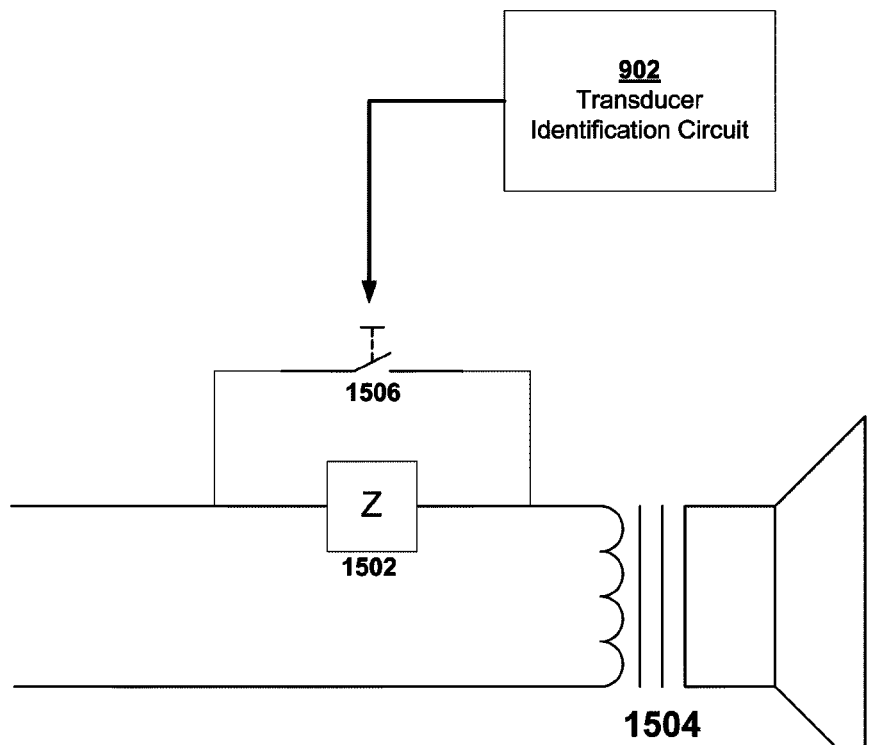
FIG. 15A shows impedance modulation with a fixed impedance load in series with the transducer.

There are several methods to modulate the impedance of the conductor. FIG. 15A shows fixed impedance load 1502 in series with transducer 1504. Transducer information circuit 902 controls switch 1506 which is in parallel with fixed impedance load 1502. When switch 1506 is closed, fixed impedance load 1502 is bypassed and does not affect the impedance of the conductor. When switch 1506 is open, fixed impedance load 1502 adds to the impedance of the conductor. More specifically, if $Z_{trans}$ is the impedance of the transducer and $Z_{fixed}$ is the impedance of load 1502, transducer information circuit 902 modulates the impedance between $Z_{trans}$ and $Z_{trans}+Z_{fixed}$. In this case, $Z_{fixed}$ should not be chosen to be too large, for a large impedance would draw power away from the transducer.

Figure 15B:
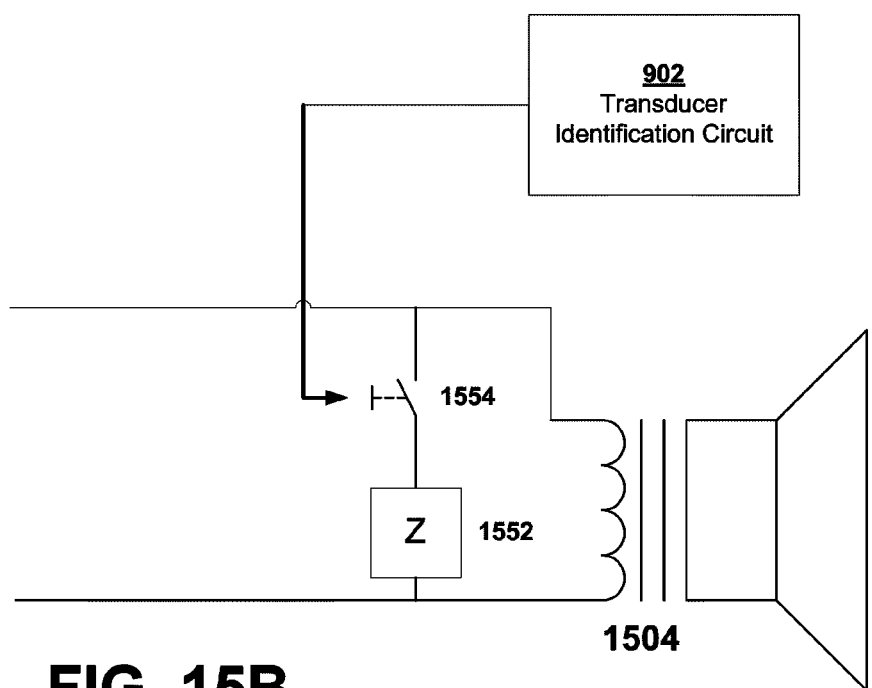
FIG. 15B shows impedance modulation with a fixed impedance load in parallel with the transducer.

FIG. 15B shows fixed impedance load 1552 in parallel with transducer 1504. Once again transducer information circuit 902 can modulate the impedance by controlling switch 1554 which is in series with fixed impedance load 1552. When switch 1554 is closed fixed impedance load 1552 is placed in parallel with transducer 1504. When switch 1554 is open fixed impedance load 1552 does not affect the impedance of the line. In this case transducer information circuit 902 modulates the impedance between $$Z_{trans} \text{ and } \frac{1}{\frac{1}{Z_{trans}}+\frac{1}{Z_{fixed}}}.$$

In this case, $Z_{fixed}$ should not be chosen to be too small, for a small impedance would draw power away from the transducer.

Figure 16A:
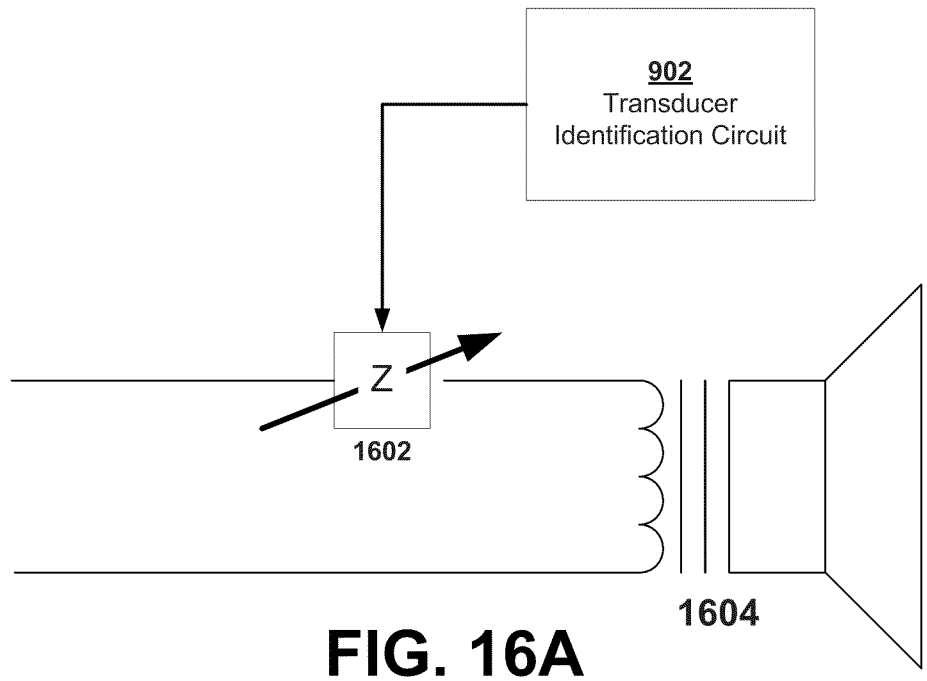
FIG. 16A shows impedance modulation where a variable controlled impedance load is in series with the transducer.

Alternatively rather than operating a switch, a variable impedance load can be used, the variable impedance load could range from $Z_{min}$ to $Z_{max}$. The variable impedance load would have an electrically controlled impedance. FIG. 16A shows impedance modulation where a variable controlled impedance load is in series with the transducer. Transducer information circuit 902 can modulate the impedance on the conductor by varying the impedance of variable impedance load 1602. The impedance on the conductor can be modulated between $Z_{trans}+Z_{min}$ and $Z_{trans}+Z_{max}$. Ideally, $Z_{min}=0$ and $Z_{max}$ would not be too large.

Figure 16B:
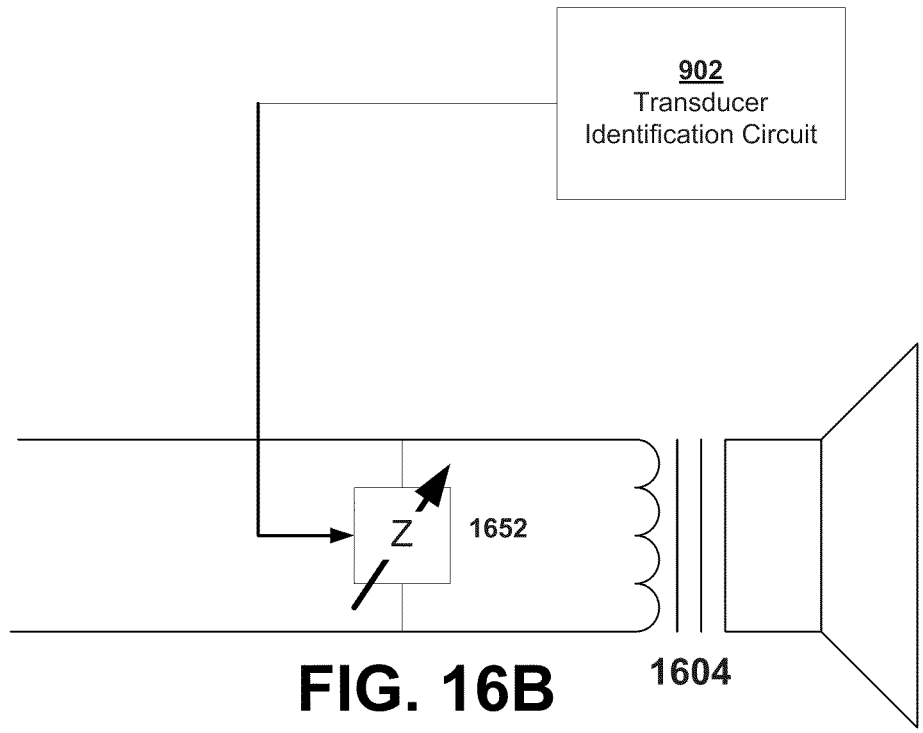
FIG. 16B shows impedance modulation where a variable controlled impedance load is in parallel with the transducer.

FIG. 16B shows impedance modulation where a variable controlled impedance load is in parallel with transducer 1604. Transducer information circuit 902 can modulate the impedance on the conductor by varying the impedance of variable impedance load 1652. The impedance on the conductor can be modulated between $$\frac{1}{\frac{1}{Z_{trans}}+\frac{1}{Z_{min}}} \text{ and } \frac{1}{Z_{trans}+Z_{max}}.$$

Ideally, $Z_{max}=\infty$ and $Z_{min}$ would not be too small.

Similar to the RFID implementation, during QA testing, measurements for the specific transducer can be stored in the transducer information circuit allow for additional accuracy, improved compensation and improved enhancement.

With the knowledge of the transducer profiles by any of the methods described above. Not only can the inaccuracies of the transducers be compensated, but other output profiles can be mimicked. For example, headphones may require different characteristics than a speaker. Generally speaking, for an external speaker, a flat output response over the audible range is desired. However, because headphones are uniquely situated on the human ear, factors such as resonances and reflections in the ear canal can affect the way sound is perceived. In addition, headphones come in all types, some are in the ear while other sit on top of the ears. Each of these requires different frequency responses or output profiles to sound natural. From the point of view of a best output generation, transducer profiles along with known perception characteristics such as the Fletcher-Munson curve can be used to derive an ideal output frequency response. However, sound perception is subjective. For example, some people prefer a heavy contribution in bass because they can "feel" the music. Others prefer treble (high frequency) enhancement for more "clarity." In addition, human hearing degenerates with age and exposure to loud sound. In general, high frequency hearing is impaired the most. As a result, as we get older, we might prefer a higher treble level.

Still others prefer a particular profile for different kinds of music. For example, listeners often prefer increased bass when listening to rock music, increased treble for jazz music and flat response for classical music. Therefore, a collection of output profiles for the type of listener and the type of music could be stored and the output profile can be used as desired by the end user in conjunction with the transducer compensation. It should be emphasized that though many stereo systems and personal electronic devices to offer the ability for the end user to select a preset or profile based on musical preference, they do not use transducer specific information. Without the use of transducer specific information, a precise reproduction of a given output profile cannot be matched.

Finally, for the true audiophile, the profile of high end headphones and speakers can be stored as output profiles. For example, many audiophiles keep several sets of expensive headphones for listening to particular types of music. With the output profiles of various speakers and headphones, an end user can experience the same sounds with their own headphones as any other model of headphones.

Figure 17:
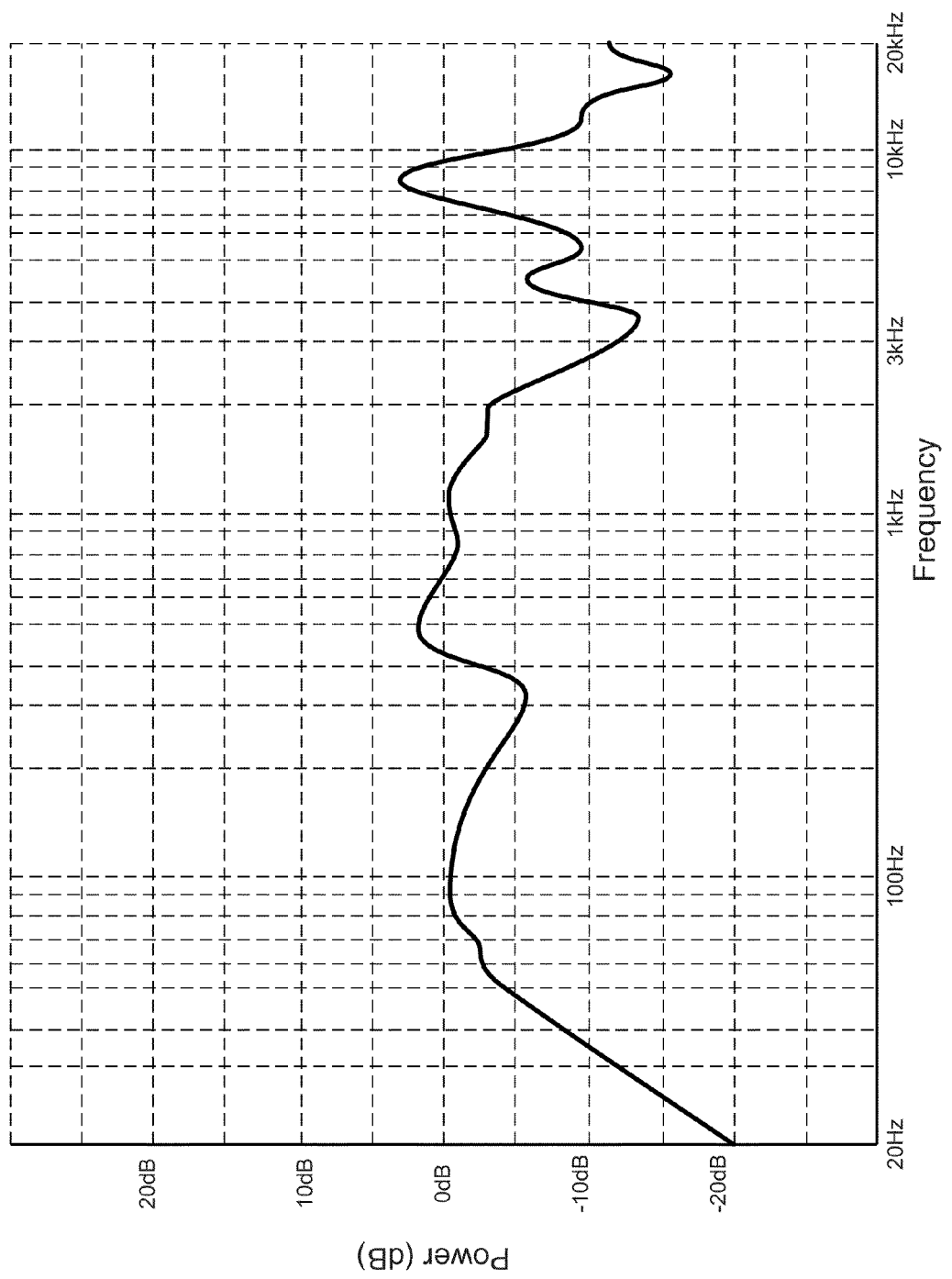
FIG. 17 illustrates a sample frequency response for an output.

FIG. 17 illustrates a sample frequency response for an output. In this particular instance, the frequency response is for high end headphones. But in maintaining generality, it could be a profile for listening to a particular type of music, or a profile for a particular demographic of listener. This profile can be made available to a host device.

Figure 18:
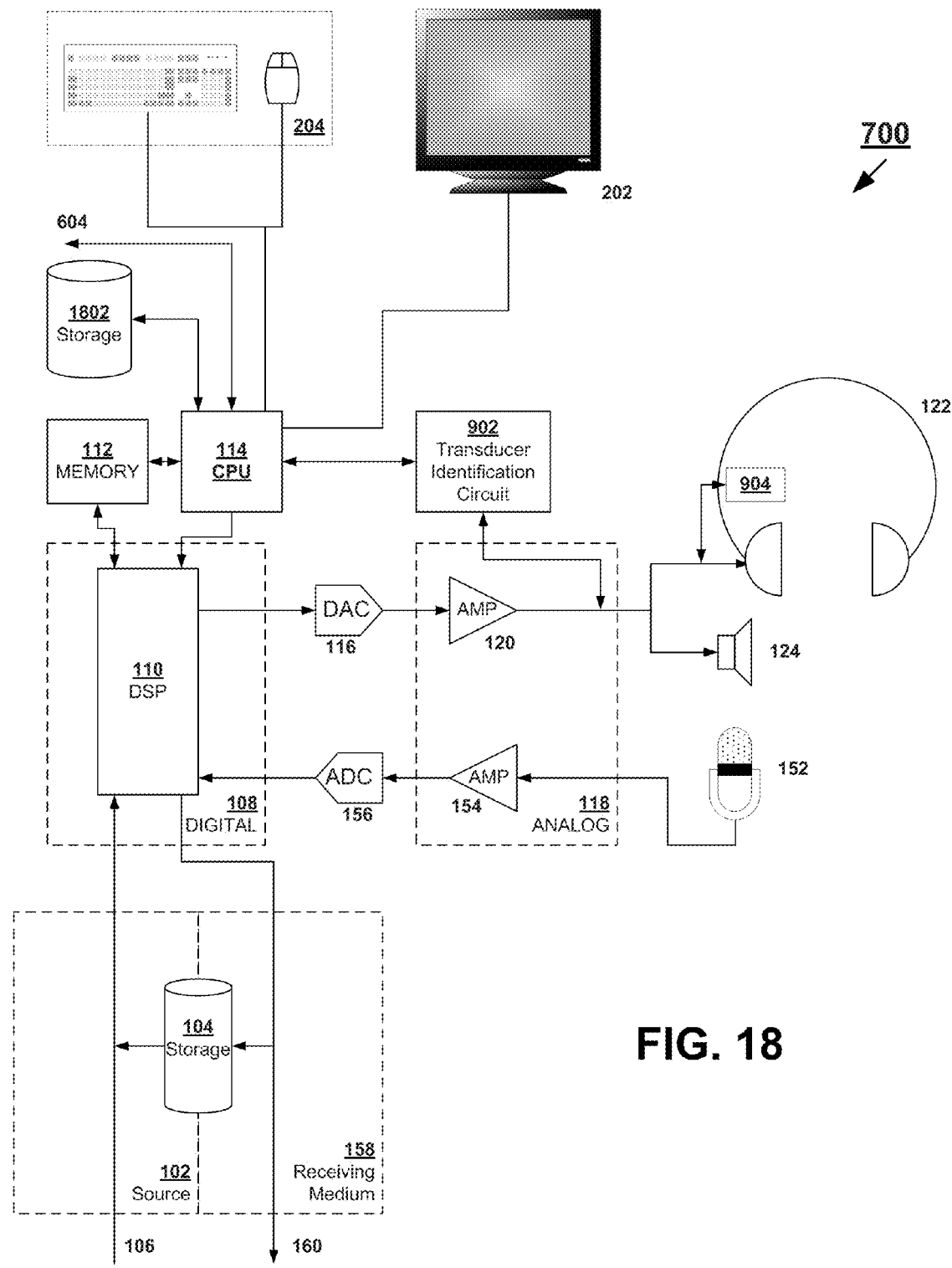
FIG. 18 illustrates a system where not only transducer inaccuracies are compensated for but the reproduction can be made to match a given output profile.

FIG. 18 illustrates a system where not only transducer inaccuracies are compensated for but the reproduction can be made to match a given output profile. An end user using display 202 and I/O device 204 can specify the desired profile for listening. This can be any of the choices described above. The profile could be stored in storage 1802 which could be an internal hard disk or supplied by a removable medium, such as a compact disc or digital video disc. In one embodiment, storage 104 comprises storage 1802. Alternatively, the profile could be retrieved from computer network 604 such as the Internet. It may even be a subscription based service where the end user subscribes to audio profiles of high end equipment. Upon receiving the transducer profile from transducer information circuit 902 and transducer communications circuit 904, CPU 114 can direct DSP 110 to compensate for inaccuracies in the transducer and apply desired output profile.

Figure 19:
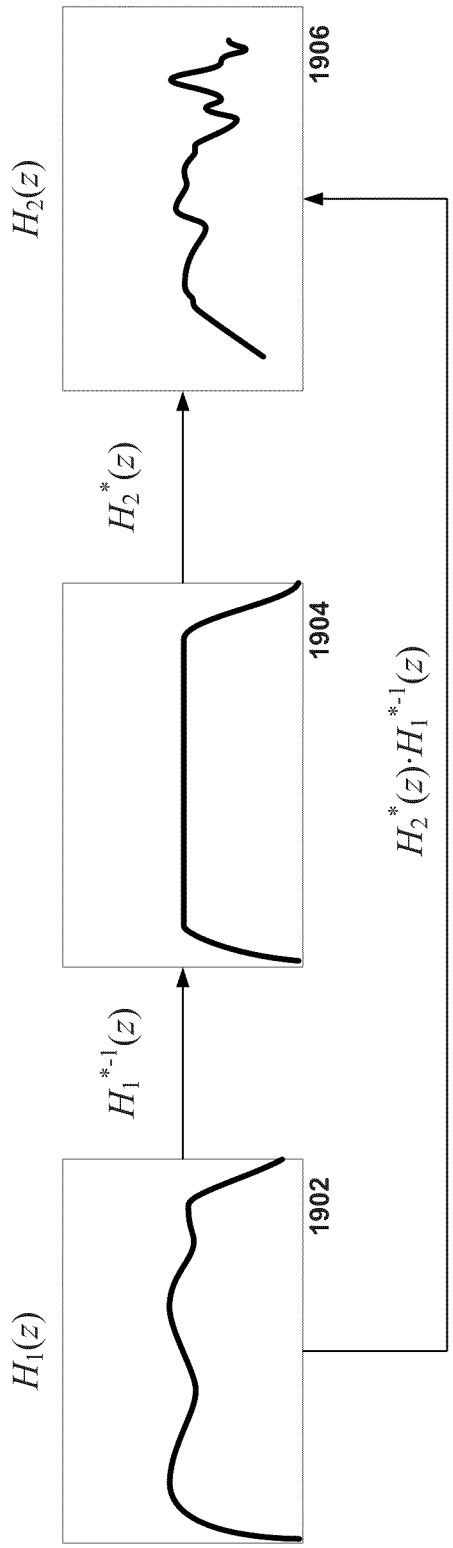
FIG. 19 illustrates how the desired output profile can be applied.

FIG. 19 illustrates how the desired output profile can be applied. Profile 1902 is the transducer's frequency response, which essentially is the transfer function, $H_1(z)$, from a flat response to the output of the transducer. Profile 1904 is the "ideal" transducer profile which is flat over the audible range. Notationally, $H_1^*(z)$ represents the transfer function from 1904 to 1902 which is approximately $H_1(z)$. Profile 1906 is the selected desired output profile with transfer function $H_2(z)$. The transfer function from profile 1904 to 1906 is denoted by $H_2^*(z)$ which is approximately $H_2(z)$. Therefore, the transfer function from profile 1902 to 1906 is $H_1^{*-1}(z) H_2^*(z)$. DSP 110 can construct either an FIR or IIR based on the impulse response of $H_1^{*-1}(z) H_2^*(z)$ or by convolving the impulse responses of $H_1^{*-1}(z)$ and $H_2^*(z)$. While in general it might be easier to generate the FIR or IIR's based on the product of $H_1^{*-1}(z) H_2^*(z)$. The output profiles could be stored in terms of their impulse responses and the impulse response of $H_1^{*-1}(z)$, which is determined whenever the transducer is plugged in. Because the user may change profiles at any time, it may be more efficient to store the impulse responses and convolve them whenever a new profile is selected.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. A host device comprising:
   a processor;
   a memory operable to store instructions for the processor;
   a sound system comprising a digital signal processor;
   a transducer information circuit coupled to a transducer and configured to generate a transducer identifier;
   a transducer communication circuit coupled to the transducer information circuit and configured to receive the transducer identifier and to transmit the transducer identifier; and
   a power extraction coupled to the sound system and configured to extract a power signal from the sound system and to provide the power signal to the transducer communication circuit;
   wherein the instructions cause the processor to
      receive the transducer identifier from the transducer communication circuit;
      retrieve a transducer profile corresponding to the transducer identifier, the transducer profile comprises transducer sensitivity associated with the transducer identifier; and
      apply a transducer compensation to the sound system on the basis of the transducer profile by causing the digital signal processor to:
      calculate a sound pressure level (SPL) on the basis of the transducer sensitivity and an output signal from the sound system;
      to compare the SPL to a maximum safe level; and
      to cause the processor to display a warning on the display.

2. The host device of claim 1, further comprising:
   a display;
   a user interface; and
   a database of transducer profiles;
   wherein the instructions cause the processor to receive the transducer identifier by displaying a prompt for the transducer identifier on the display; and
      receiving the transducer identifier from the user interface; and
   wherein the instructions cause the processor to retrieve the transducer profile by retrieving the transducer profile from the database corresponding to the transducer identifier.

3. The host device of claim 2, wherein the compensation filter produces a new frequency response curve which mimics another transducer's frequency response curve.

4. The host device of claim 1, wherein the transducer profile comprises a frequency response curve associated with the transducer identifier and the processor applies the transducer compensation by causing the digital signal processor to apply a compensation filter on the basis of the frequency response curve.

5. The host device of claim 1, wherein the transducer profile comprises Fletcher-Munson curves associated with the transducer identifier and the processor applies the transducer compensation by causing the digital signal processor to adjust an amplitude of an output signal from the sound system to match a Fletcher-Munson curve.

6. The host device of claim 1, wherein the transducer profile comprises distortion vulnerable frequencies associated with the transducer identifier and the processor applies the transducer compensation by causing the digital signal processor to dynamically equalize an output signal from the sound system to avoid the vulnerable frequencies.

7. The host device of claim 1, wherein the transducer profile comprises a low frequency cut off associated with the transducer identifier and the processor applies the transducer compensation by causing the digital signal processor to supply a virtual bass signal on the basis of the low frequency cut off.

8. The host device of claim 1, wherein the transducer profile comprises transducer sensitivity associated with the transducer identifier, and the processor applies the transducer compensation by setting an analog boost for the transducer on the basis of the transducer sensitivity.

9. The host device of claim 1, wherein the transducer profile comprises a frequency response curve and transducer sensitivity associated with the transducer identifier wherein the instructions cause the processor to further determine calibration data based on the frequency response curve and the transducer sensitivity.

10. The host device of claim 1, the transducer profile comprises a transducer type, a the transducer manufacturer, a model number and a universal product code (UPC) a frequency response curve, transducer impedance, transducer sensitivity, a manufacturer suggested enhanced response curve, Fletcher-Munson curves, a low frequency cut off, a transducer power rating, critical distortion points, limits based on frequency or a combination thereof.

11. The host device of claim 1, wherein the transducer profile comprises a transducer power rating associated with the transducer identifier and the processor applies the transducer compensation by causing the digital signal processor
   to estimate an output power of an output signal from the sound system;
   to compare the output power to the transducer power rating; and
   to attenuate the output signal if the output power exceeds.

12. The host device of claim 1, further comprising:
   the transducer communication circuit operable to receive transducer identification information from the transducer.

13. The host device of claim 12 wherein the host device further comprises a database of transducer profiles; and the transducer information comprises a transducer identifier and wherein the instructions cause the processor to retrieve a transducer profile by retrieving the transducer identifier from the transducer communication circuit and retrieve an associated transducer profile from the database.

14. The host device of claim 12, wherein the transducer communication circuit receives the transducer information through a USB port coupled to the transducer.

15. The host device of claim 12, wherein the transducer communication circuit receives transducer information from the transducer having an impedance by detecting modulation in the impedance of the transducer.

16. The host device of claim 12, wherein the transducer communication circuit receives the transducer information through a conductor in a tip-ring-ring-sleeve (TRRS) jack coupled to a transducer.

17. The host device of claim 12, wherein the transducer communication circuit receives the transducer info anon through a conductor in a tip-ring-sleeve (TRS) jack coupled to a transducer.

18. The host device of claim 12, wherein the transducer communication circuit receives the transducer information through both a right channel and a left channel in a TRS jack coupled to a transducer.

19. The host device of claim 12, wherein the transducer communication circuit comprises an RFID transmitter and receives the transducer information from an RFID tag attached to the transducer.

20. The host device of claim 12, wherein the transducer communication circuit receives transducer information when a transducer is connected.

21. The host device of claim 12, wherein the transducer communication circuit receives transducer information during an initialization phase before audio functions are enabled.

22. A method for transducer enhancement in a sound system in a host device comprising:
   extracting a power signal using a power extraction circuit coupled to the sound system;
   providing the power signal to a transducer information circuit and a transducer communication circuit;
   generating a transducer identifier using the transducer information circuit;
   receiving the transducer identifier at the transducer communication circuit coupled to the transducer information circuit;
   transmitting the transducer identifier to a processor;
   receiving a transducer profile associated with the transducer identifier; and
   applying a transducer compensation to the sound system on the basis of the transducer profile;
   wherein the transducer profile comprises transducer sensitivity associated with the transducer identifier and applying the transducer compensation comprises:
     calculating a sound pressure level (SPL) on the basis of the transducer sensitivity and an output signal from the sound system; and
     comparing the SPL to a maximum safe level.

23. The method of claim 22 further comprising:
   displaying a prompt for the transducer identifier on a display on the host device;
   receiving the transducer identifier from a user interface on the host device.

24. The method of claim 22 wherein receiving the transducer profile comprises;
   retrieving the transducer profile from a database.

25. The method of claim 22 wherein receiving the transducer profile comprises:
   retrieving the transducer profile over a computer network.

26. The method of claim 22 wherein the transducer profile comprises a frequency response curve associated with the transducer identifier and applying the transducer compensation comprises applying a compensation filter on the basis of the frequency response curve.

27. The method of claim 22 wherein the transducer profile comprises Fletcher-Munson curves associated with the transducer identifier and applying the transducer compensation comprises adjusting the amplitude of an output signal from the sound system to match a Fletcher-Munson curve.

28. The method of claim 22 wherein the transducer profile comprises distortion vulnerable frequencies associated with the transducer identifier and applying the transducer compensation comprises dynamically equalizing an output signal from the sound system to avoid the vulnerable frequencies.

29. The method of claim 22 wherein the transducer profile comprises a low frequency cut off associated with the transducer identifier and applying the transducer compensation comprises supplying a virtual bass signal on the basis of the low frequency cut off.

30. The method of claim 22 wherein applying the transducer compensation comprises:
attenuating the output signal if the SPL exceeds the maximum safe level.

31. The method of claim 22 wherein the transducer profile comprises transducer sensitivity associated with the transducer identifier, wherein the transducer is a microphone and applying the transducer compensation comprises:
setting an analog boost for the microphone on the basis of the transducer sensitivity.

32. The method of claim 22 wherein the transducer profile comprises a frequency response curve and transducer sensitivity associated with the transducer identifier, said method further comprising determining calibration data based on the frequency response curve and the transducer sensitivity.

33. The method of claim 22 wherein applying the transducer compensation comprises:
displaying a warning to an end user.

34. The method of claim 22 wherein the transducer profile comprises a transducer power rating associated with the transducer identifier and applying the transducer compensation comprises:
estimating an output power of an output signal from the sound system;
comparing the output power to the transducer power rating; and
attenuating the output signal if the output power exceeds the transducer power rating.

35. The method of claim 22 further comprising:
requesting transducer information from a transducer with the transducer communication circuit.

36. The method of claim 35 wherein the transducer information comprises the transducer identifier, said method further comprising retrieving the transducer profile based on the transducer identifier.

37. The method of claim 35 wherein the transducer information comprises the transducer profile.

38. The method of claim 35 wherein the transducer information is received through a USB port.

39. The method of claim 35 wherein the transducer information is received from impedance modulation generated by the transducer.

40. The method claim 35 wherein the transducer information is received through a TRRS jack or a TRS jack.

41. The method of claim 35 wherein the transducer information is received from an RFID tag attached to the transducer.

42. A method for transducer enhancement in a sound system in a host device comprising:
extracting a power signal using a power extraction circuit coupled to the sound system;
providing the power signal to a transducer information circuit and a transducer communication circuit;
generating a transducer identifier using the transducer information circuit;
receiving the transducer identifier at the transducer communication circuit coupled to the transducer information circuit;
transmitting the transducer identifier to a processor;
receiving a transducer profile associated with the transducer identifier; and
applying a transducer compensation to the sound system on the basis of the transducer profile;
wherein the transducer profile comprises transducer sensitivity associated with the transducer identifier and applying the transducer compensation comprises:
calculating a sound pressure level (SPL) on the basis of the transducer sensitivity and an output signal from the sound system;
comparing the SPL to a maximum safe level; and
attenuating the output signal if the SPL exceeds the maximum safe level.

43. The method of claim 42 further comprising:
displaying a prompt for the transducer identifier on a display on the host device;
receiving the transducer identifier from a user interface on the host device.

44. The method of claim 43 wherein receiving the transducer profile comprises;
retrieving the transducer profile from a database.

45. The method of claim 43 wherein receiving the transducer profile comprises:
retrieving the transducer profile over a computer network.

46. A method for transducer enhancement in a sound system in a host device comprising:
extracting a power signal using a power extraction circuit coupled to the sound system;
providing the power signal to a transducer information circuit and a transducer communication circuit;
generating a transducer identifier using the transducer information circuit;
receiving the transducer identifier at the transducer communication circuit coupled to the transducer information circuit;
transmitting the transducer identifier to a processor;
receiving a transducer profile associated with the transducer identifier; and
applying a transducer compensation to the sound system on the basis of the transducer profile;
wherein the transducer profile comprises transducer sensitivity associated with the transducer identifier and applying the transducer compensation comprises:
calculating a sound pressure level (SPL) on the basis of the transducer sensitivity and an output signal from the sound system;
comparing the SPL to a maximum safe level; and
displaying a warning to an end user.

47. The method of claim 46 further comprising:
displaying a prompt for the transducer identifier on a display on the host device;
receiving the transducer identifier from a user interface on the host device.

48. The method of claim 46 wherein receiving the transducer profile comprises;
retrieving the transducer profile from a database.

49. The method of claim 46 wherein receiving the transducer profile comprises:
retrieving the transducer profile over a computer network.

* * * * *

UNITED STATES PATENT AND TRADEMARK OFFICE
CERTIFICATE OF CORRECTION

PATENT NO. : 8,682,002 B2  
APPLICATION NO. : 12/828565  
DATED : March 25, 2014  
INVENTOR(S) : James Walter Wihardja and Mouna Elkhatib Page 1 of 1

It is certified that error appears in the above-identified patent and that said Letters Patent is hereby corrected as shown below:

In the Claims

Column 15, line 32, claim 10, delete "the"

Signed and Sealed this
Twelfth Day of August, 2014

Michelle K. Lee
*Deputy Director of the United States Patent and Trademark Office*